(12) United States Patent
Tsuboi et al.

(10) Patent No.: US 10,340,291 B2
(45) Date of Patent: Jul. 2, 2019

(54) SEMICONDUCTOR DEVICE

(71) Applicant: Renesas Electronics Corporation, Koutou-ku, Tokyo (JP)

(72) Inventors: Nobuo Tsuboi, Tokyo (JP); Yoshiki Yamamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/721,901

(22) Filed: Sep. 30, 2017

(65) Prior Publication Data

US 2018/0138204 A1 May 17, 2018

(30) Foreign Application Priority Data

Nov. 15, 2016 (JP) .................................. 2016-222054

(51) Int. Cl.
*H01L 21/8238* (2006.01)
*H01L 27/12* (2006.01)
(Continued)

(52) U.S. Cl.
CPC .......... *H01L 27/1203* (2013.01); *G05F 1/625* (2013.01); *H01L 27/02* (2013.01); *H01L 27/0207* (2013.01); *H01L 27/1244* (2013.01); *H01L 29/41733* (2013.01); *H01L 29/78* (2013.01); *H03K 17/687* (2013.01); *H01L 21/8238* (2013.01); *H01L 21/823871* (2013.01); *H01L 21/84* (2013.01)

(58) Field of Classification Search
CPC ................. H01L 27/1203; H01L 21/84; H01L 21/823871

USPC ........................................................ 257/347
See application file for complete search history.

(56) References Cited

U.S. PATENT DOCUMENTS 9,997,393 B1 * 6/2018 Wang .................... H01L 21/743
2005/0176184 A1 * 8/2005 Okihara .................. H01L 21/84
438/151

(Continued)

FOREIGN PATENT DOCUMENTS

JP          2015-027068 A          2/2015

OTHER PUBLICATIONS

Extended European search report for European Patent Application No. 17195589.1, dated Jul. 18, 2018.

(Continued)

*Primary Examiner* — George R Fourson, III
(74) *Attorney, Agent, or Firm* — Shapiro, Gabor and Rosenberger, PLLC

(57) ABSTRACT

Reliability of a semiconductor device is improved. A p-type MISFET of a thin film SOI type is formed in an SOI substrate including a semiconductor substrate, an insulating layer on the semiconductor substrate, and a semiconductor layer on the insulating layer, and $n^+$-type semiconductor regions which are source and drain region of the p-type MISFET are formed in the semiconductor layer and an epitaxial layer on the semiconductor layer. A semiconductor layer is formed via the insulating layer below the p-type MISFET formed in the n-type well region of the semiconductor substrate. In an n-type tap region which is a power supply region of the n-type well region, a silicide layer is formed on a main surface of the n-type well region without interposing the epitaxial layer therebetween.

13 Claims, 24 Drawing Sheets

(51) Int. Cl.

| | |
|---|---|
| *G05F 1/625* | (2006.01) |
| *H01L 29/78* | (2006.01) |
| *H03K 17/687* | (2006.01) |
| *H01L 27/02* | (2006.01) |
| *H01L 29/417* | (2006.01) |
| *H01L 21/84* | (2006.01) |

(56) References Cited

U.S. PATENT DOCUMENTS

| | | | |
|---|---|---|---|
| 2008/0057712 A1 | 3/2008 | Liu | |
| 2008/0111154 A1* | 5/2008 | Voldman | H01L 21/8249 |
| | | | 257/192 |
| 2010/0148219 A1 | 6/2010 | Shimizu | |
| 2013/0256901 A1* | 10/2013 | Scheiper | H01L 21/28518 |
| | | | 257/774 |
| 2014/0375379 A1* | 12/2014 | Makiyama | G05F 1/625 |
| | | | 327/537 |
| 2016/0013207 A1* | 1/2016 | Makiyama | H01L 27/1207 |
| | | | 257/350 |

OTHER PUBLICATIONS

Partial European search report for European Patent Application No. 17195589.1, dated Apr. 5, 2018.

* cited by examiner

SEMICONDUCTOR DEVICE

CROSS-REFERENCE TO RELATED APPLICATION

The present application claims priority from Japanese Patent Application No. 2016-222054 filed on Nov. 15, 2016, the content of which is hereby incorporated by reference into this application.

TECHNICAL FIELD OF THE INVENTION

The present invention relates to a semiconductor device. For example, the present invention can be suitably used for a semiconductor device using an SOI substrate.

BACKGROUND OF THE INVENTION

In order to produce a semiconductor device, an element isolation region is formed in a semiconductor substrate, and a semiconductor element such as a MISFET (Metal Insulator Semiconductor Field Effect Transistor) is formed in an active region of a semiconductor substrate defined by the element isolation region, and a multilayer wiring structure is formed on the semiconductor substrate. Also, there is a technique using an SOI substrate as a semiconductor substrate.

Japanese Patent Application Laid-Open Publication No. 2015-27068 (Patent Document 1) relates to an MISFET using an SOI substrate so that the SOI substrate includes a support substrate 1, a BOX layer 2a formed on the support substrate 1, and an SOI layer 3a formed on the BOX layer 2a. For example, in FIG. 11, a plurality of p-channel type MISFETs QP5 are formed on the SOI layer 3a on an n-type well 5 of the support substrate 1, and a substrate bias Vbp is applied to the n-type well 5 through a first wiring 16.

SUMMARY OF THE INVENTION

It is desired to improve reliability of a semiconductor device produced by using an SOI substrate.

Other object and novel characteristics will be apparent from the description of the present specification and the accompanying drawings.

According to an embodiment, a semiconductor device includes: a semiconductor substrate including a main surface and a back surface; a first semiconductor region of a first conductivity type formed in the semiconductor substrate; a first active region and a second active region whose peripheries are defined by an element isolation region in the first semiconductor region; a first semiconductor layer formed on the main surface of the semiconductor substrate via a first insulating film in the first active region; a first gate electrode formed on a surface of the first semiconductor layer via a first gate insulating film; a first sidewall spacer formed on a side wall of the first gate electrode; first epitaxial layers formed on the first semiconductor layer at both sides of the first gate electrode; a second semiconductor region and a third semiconductor region of a second conductivity type formed in the first semiconductor layer and the first epitaxial layers at both sides of the first gate electrode, the second conductivity type being a conductivity type opposite to the first conductivity type; a fourth semiconductor region of the first conductivity type formed below the first insulating film in the first active region; a first silicide layer formed on a surface of the first semiconductor region in the second active region; an interlayer insulating film covering the first gate electrode; and a first power supply wiring formed over the interlayer insulating film. In a plan view, the second active region extends in a first direction. In a plan view, the first power supply wiring extends in the first direction so as to overlap with the second active region. The first power supply wiring is connected to the second semiconductor region. The first gate electrode extends in a second direction perpendicular to the first direction, and lies on the element isolation region between the first active region and the second active region.

According to an embodiment, the reliability of the semiconductor device can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are mentioned, the substantially approximate and similar shapes and others are included therein unless otherwise stated or except the case where it is conceivable that they area apparently excluded in principle. The same goes for the numerical value and the range described above.

Hereinafter, the embodiments will be described in detail with reference to the accompanying drawings. Note that components having the same function are denoted by the same reference symbols throughout all the drawings for describing the embodiments, and the repetitive description thereof will be omitted. In addition, the description of the same or similar portions is not repeated in principle unless particularly required in the following embodiments.

In some drawings used in the embodiments, hatching is omitted even in a cross-sectional view so as to make the drawings easy to see in some cases. Also, hatching is used even in a plan view so as to make the drawings easy to see in some cases.

First Embodiment

Explanation about Related Art

Figure 1:
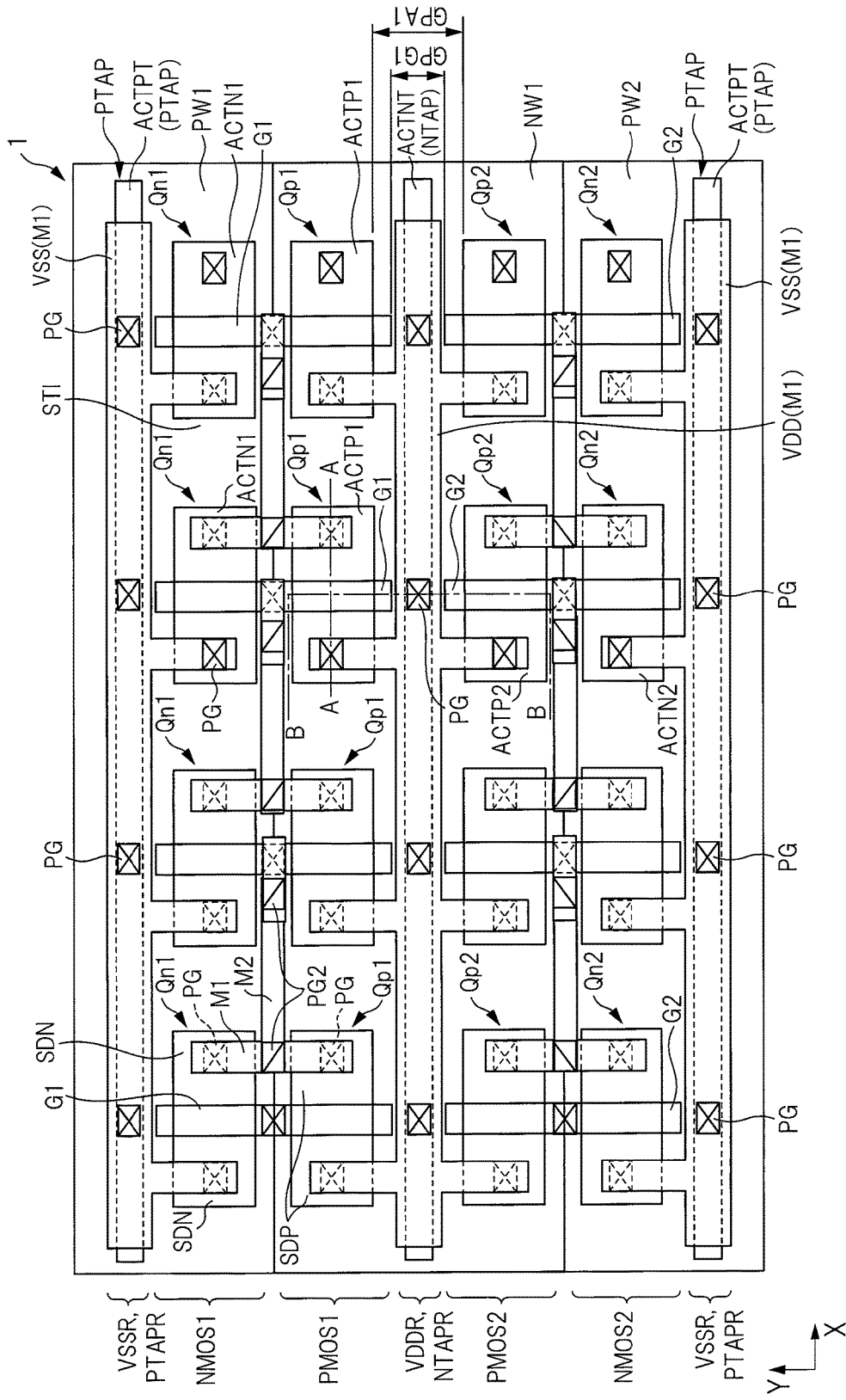
FIG. 1 is a plan view of a semiconductor device of a related art.
Figure 2:
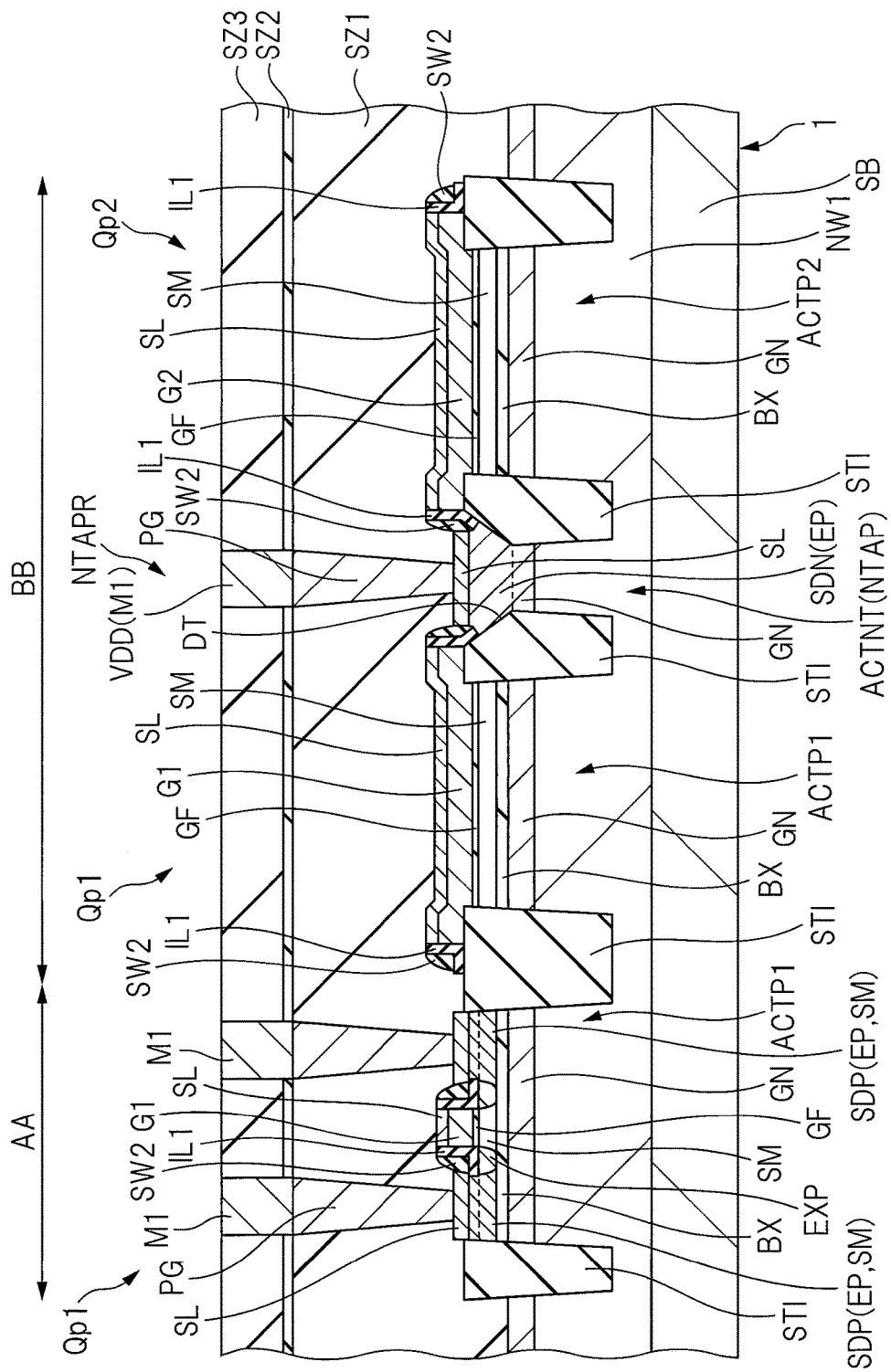
FIG. 2 is a cross-sectional view taken along lines A-A and B-B of FIG. 1.

FIG. 1 is a plan view of a semiconductor device of a related art. FIG. 2 is a cross-sectional view taken along lines A-A and B-B of FIG. 1. A cross-sectional view taken along the line A-A is shown in a region AA, and a cross-sectional view along a line B-B is shown in a region BB.

As shown in FIG. 1, a semiconductor device according to a related art includes n-type MISFETs Qn1 and Qn2 and p-type MISFETs Qp1 and Qp2 formed on the SOI (Silicon On Insulator) substrate 1. As explained later, the SOI substrate 1 includes a semiconductor substrate (support substrate) SB serving as a support substrate, an insulating layer (buried insulating film) BX formed on the main surface of the semiconductor substrate SB, and a semiconductor layer SM formed on an upper surface of the insulating layer BX. The n-type MISFETs Qn1 and Qn2 and the p-type MISFETs Qp1 and Qp2 are thin film SOI type MISFETs formed in the semiconductor layer SM, and are complete depletion-type MISFETs.

As shown in FIG. 1, an NMOS region NMOS1, a PMOS region PMOS1, a PMOS region PMOS2, and an NMOS region NMOS2 are provided in an order from an upper side to a lower side in a Y direction. The NMOS regions NMOS1 and NMOS2 and the PMOS regions PMOS1 and PMOS2 have desired heights in the Y direction, and have desired lengths in an X direction (perpendicular to the Y direction). In other words, the NMOS regions NMOS1 and NMOS2 and the PMOS regions PMOS1 and PMOS2 extend in the X direction. In each of the NMOS regions NMOS1 and NMOS2, a plurality of n-type MISFETs Qn1 and Qn2 are arranged side by side in the X direction. In each of the PMOS regions PMOS1 and PMOS2, a plurality of p-type MISFETs Qp1 and Qp2 are arranged side by side in the X direction. The n-type MISFETs Qn1 and Qn2 are formed in active regions ACTN1 and ACTN2, respectively, peripheries of which are surrounded by an element isolation region STI. The p-type MISFETs Qp1 and Qp2 are formed in active regions ACTP1 and ACTP2, respectively, the peripheries of which are surrounded by an element isolation region STI.

Between the PMOS regions PMOS1 and PMOS2, a power supply potential wiring region VDDR and an n-type tap region NTAPR extending in the X direction are provided so that a power supply potential wiring VDD and an n-type tap NTAP extending in the X direction area arranged. At the upper side of the NMOS region NMOS1 and the lower side of the NMOS region NMOS2, a reference potential wiring region VSSR and a p-type tap region PTAPR extending in the X direction are provided so that a reference potential wiring VSS and a p-type tap PTAP area arranged.

The PMOS regions PMOS1 and PMOS2 and the power supply potential wiring region VDDR are provided on an n-type well region (n-type semiconductor region) NW1 extending in the X direction. More specifically, the plurality of p-type MISFETs Qp1 and Qp2 are formed on the n-type well region NW1 (in other words, in the n-type well region NW1). The NMOS region NMOS1 and the reference potential wiring region VSSR are provided on the p-type well region (p-type semiconductor region) PW1 extending in the X direction, and the NMOS region NMOS2 and the reference potential wiring region VSSR are provided on the p-type well region PW2 extending in the X direction. More specifically, the plurality of n-type MISFETs Qn1 are formed on the p-type well region PW1 (in other words, in the p-type well region PW1), and the plurality of n-type MISFETs Qn2 are formed on the p-type well region PW2 (in other words, in the p-type well region PW2).

An active region ACTNT extending in the X direction is arranged in the n-type well region NW1 so as to overlap the power supply potential wiring VDD, and the power supply potential wiring VDD is connected to the n-type well region NW1 via a plug electrode PG, so that the power supply potential can be supplied to the n-type well region NW1. More specifically, in the active region ACTN, the insulating film BX and the semiconductor layer SM are removed.

Subsequently, a cross-sectional structure of the semiconductor device according to the related art will be explained with reference to FIG. 2. An n-type well region NW1 is formed on the main surface of the semiconductor substrate SB. An element isolation region (element isolation film) STI is formed so as to define the active regions ACTP1, ACTP2, and ACTNT in the n-type well region NW1. The n-type well region NW1 is deeper than the element isolation region STI. The n-type well regions NW1 in in the active regions ACTP1, ACTP2, and ACTNT are connected to one another. In the active regions ACTP1, ACTP2, and ACTNT, the n-type semiconductor region GN is formed on the main surface of the n-type well region NW1.

As shown in the region AA of FIG. 2, the p-type MISFET Qp1 is formed in a semiconductor layer SM that is formed in the active region ACTP1 and that is formed on the main surface of the semiconductor substrate 1 via the insulating layer BX. The p-type MISFET Qp1 includes a gate electrode G1 formed on the semiconductor layer SM via a gate insulating film GF, and a p⁻-type semiconductor region EXP and a p+-type semiconductor region SDP arranged on both sides of the gate electrode G1. The region AA is a cross-sectional view of the p-type MISFET Qp1 in the direction of the gate length. The p−-type semiconductor region EXP and the p+-type semiconductor region SDP at one end side of the gate electrode G1 serve as a source region of the p-type MISFET Qp1, and the p−-type semiconductor region EXP and the p+-type semiconductor region SDP at the other end side serve as a drain region. The semiconductor region SM between the source region and the drain region serve as a channel formation region. The p+-type semiconductor region SDP is formed from the semiconductor layer SM to an epitaxial layer EP formed on the main surface of the semiconductor layer SM. The p−-type semiconductor region EXP is formed in the semiconductor layer SM between the p+-type semiconductor region SDP and the channel formation region.

The region BB of FIG. 2 is a cross-sectional view of the p-type MISFETs Qp1 and Qp2 in the direction of the gate width. The n-type tap region NTAPR is provided between the p-type MISFETs Qp1 and Qp2. A part of the active region ACTNT from which the main surface of the n-type well region NW1 is exposed is referred to as an n-type tap NTAP. More specifically, in the n-type tap NTAP, the insulating film BX and the semiconductor layer SM on the semiconductor substrate SB are removed, and the main surface of the n-type well region NW1 is exposed. In the n-type tap NTAP surrounded by the element isolation regions STI, an n-type semiconductor region GN is formed on the main surface of the n-type well region NW1, and an epitaxial layer EP is formed on the n-type semiconductor region GN. An n+-type semiconductor region SDN is formed in the epitaxial layer EP.

Here, for example, an end portion of the gate electrode G1 arranged on the active region ACTP1 lies on the element isolation region STI defining the n-type tap NTAP. A dent DT is formed on a shoulder portion of the element isolation region STI, the shoulder portion being closer to the n-type tap NTAP. By influence of the dent DT, the upper surface of the epitaxial layer EP extends to be wider than the lower surface of the same. More specifically, by the studies of the inventors of the present application, it has been found out that the upper surface (in other words, side surface) of the epitaxial layer EP is closer to the gate electrode G1 than in a case without the dent DT, and therefore, short circuit or breakdown voltage degradation occurs between the gate electrode G1 and the n-type well region NW1. More specifically, it has been found that the reliability of the semiconductor device according to the related art is low. Note that it has been also found that similar problem occurs between the gate electrode G2 and the n-type well region NW1.

Here, the gate electrodes G1 and G2 can be spaced apart from the n-type tap NTAP so that the short circuit or the breakdown voltage degradation does not occur therebetween even if the dent DT is formed in the element isolation region STI. However, this case causes such a disadvantage as increase in an area of the semiconductor device.

Subsequently, the present first embodiment which has solved the problem of the related art will be explained.

Structure of Semiconductor Device According to First Embodiment

The semiconductor device according to the present first embodiment is different from the semiconductor device according to the related art in that the epitaxial layer EP is not provided in the n-type tap region NTAPR, and other points are the same as those in the semiconductor device according to the related art. Therefore, the explanation about the semiconductor device according to the related art can be reused as an explanation about the semiconductor device according to the present first embodiment, and therefore, the repetitive explanation thereabout will be omitted.

Figure 3:
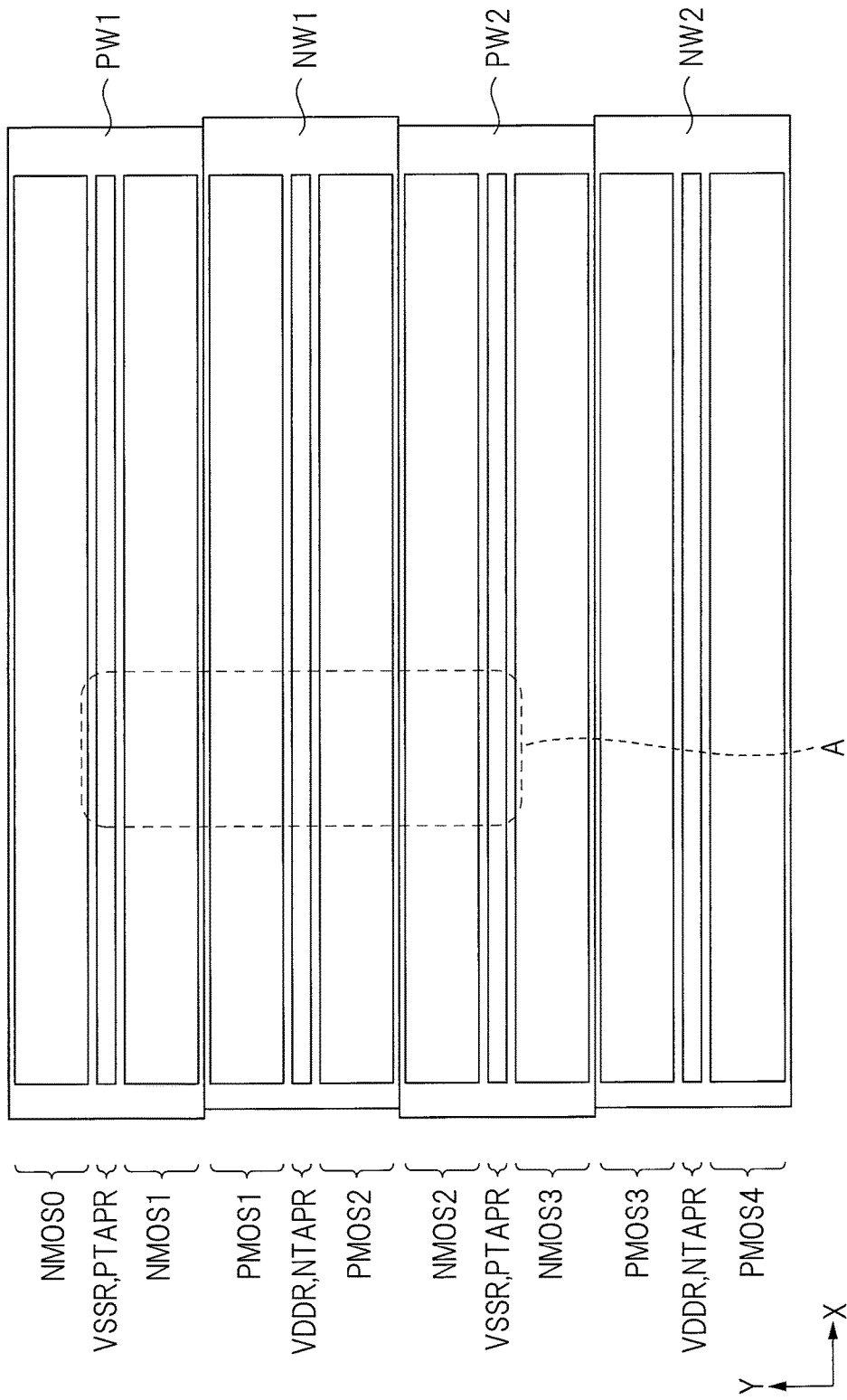
FIG. 3 is a plan view of a semiconductor device according to a first embodiment.
Figure 4:
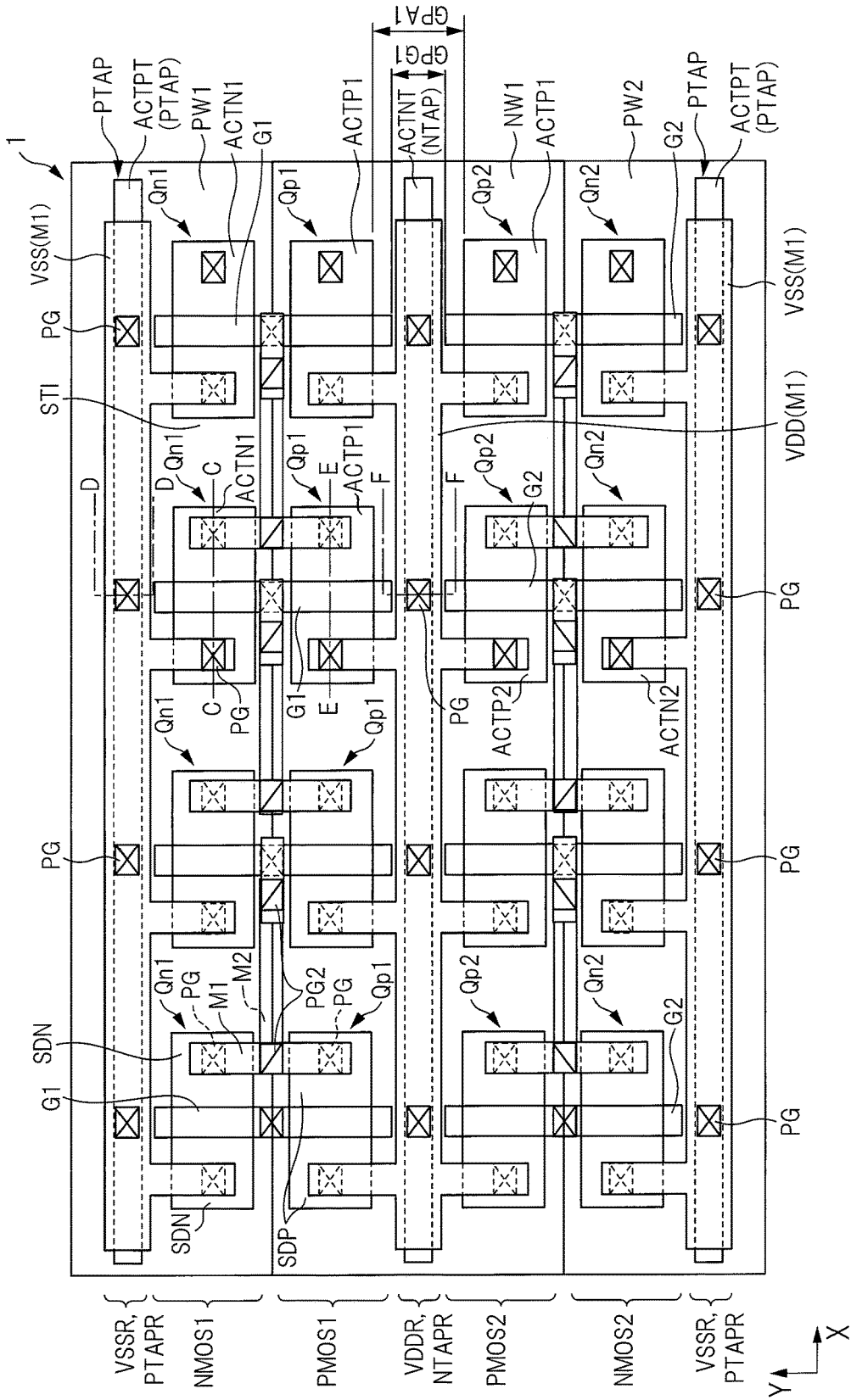
FIG. 4 is a detailed plan view of a part A of FIG. 3.
Figure 5:
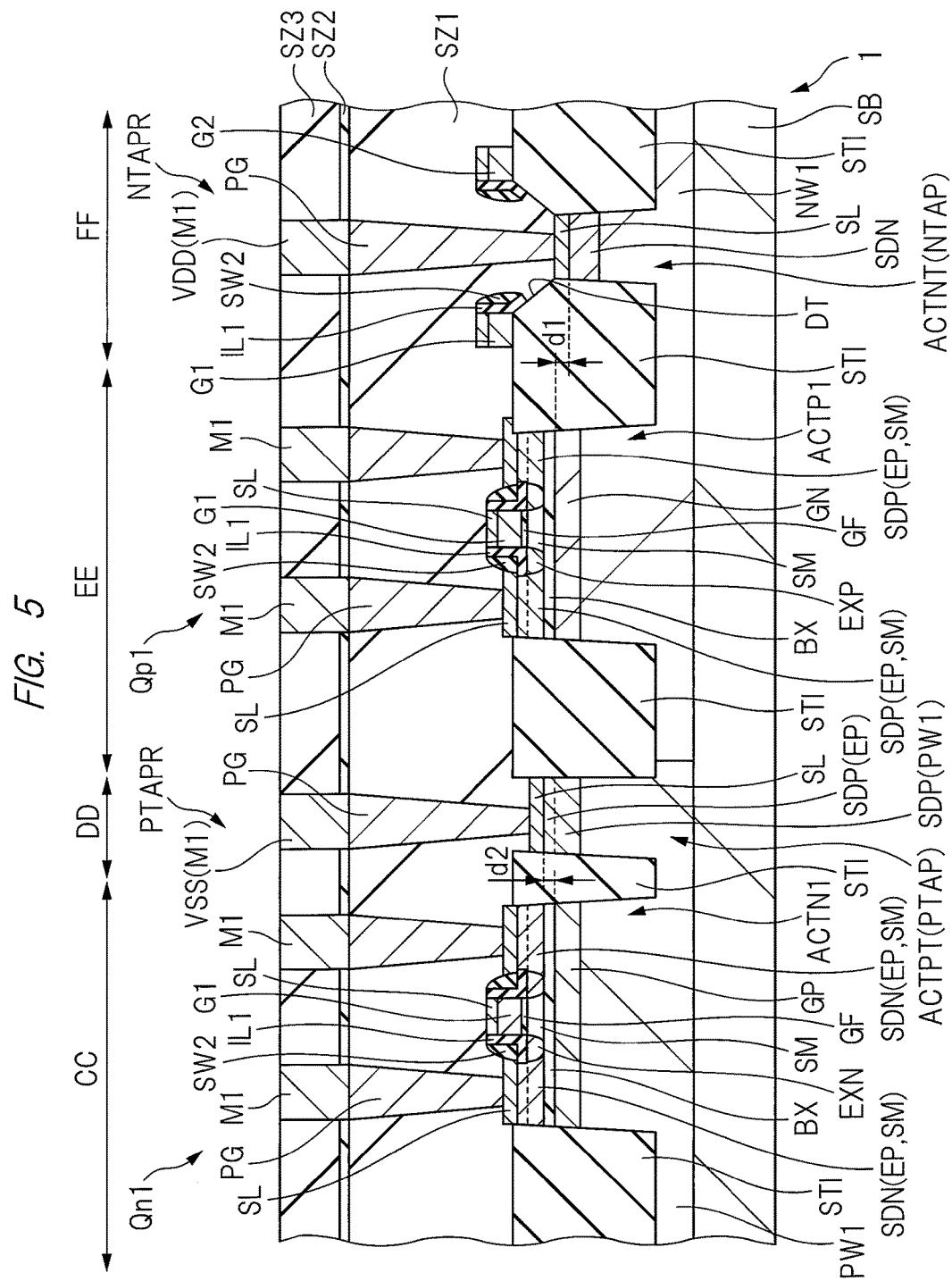
FIG. 5 is a cross-sectional view taken along lines C-C, D-D, E-E, and F-F in FIG. 4.

FIG. 3 is a plan view of a semiconductor device according to the present first embodiment. FIG. 4 is a detailed plan view of a part A of FIG. 3. FIG. 5 is a cross-sectional view taken along the lines C-C, D-D, E-E, and F-F of FIG. 4.

As shown in FIG. 3, the semiconductor device according to the present first embodiment includes a plurality of NMOS regions NMOS0, NMOS1, NMOS2, and NMOS3, and a plurality of PMOS regions PMOS1, PMOS2, PMOS3, and PMOS4 on the SOI substrate. The NMOS region NMOS0, the NMOS region NMOS1, the PMOS region PMOS1, the PMOS region PMOS2, the NMOS region NMOS2, the NMOS region NMOS3, the PMOS region PMOS3, and the PMOS region PMOS4 are disposed in an order from an upper portion to a lower portion in the Y direction. As similar to the NMOS regions NMOS1 and NMOS2, a plurality of n-type MISFETs are formed in the NMOS regions NMOS0 and NMOS3. As similar to the PMOS regions PMOS1 and PMOS2, a plurality of p-type MISFETs are formed in the PMOS region PMOS3 and PMOS4. All of the n-type MISFETs formed in the plurality of NMOS regions NMOS0, NMOS1, NMOS2, and NMOS3 and the p-type MISFETs formed in the plurality of PMOS regions PMOS1, PMOS2, PMOS3, and PMOS4 are thin film SOI type MISFETs explained above. These thin film SOI type MISFETs have the same structure as that of the n-type MISFET Qn1 or the p-type MISFET Qp1 explained below.

In the p-type well region PW1 extending in the X direction, an NMOS region NMOS0, a reference potential wiring region VSSR, and an NMOS region NMOS1 are arranged in an order in the Y direction, and a p-type tap region PTAPR extending in the X direction is arranged so as to overlap the reference potential wiring region VSSR. The p-type tap region PTAPR is a power supply region for supplying a desired potential (for example, a reference potential or a negative voltage) to the p-type well region PW1.

In the n-type well region NW1 extending in the X direction, a PMOS region PMOS1, a power supply potential wiring region VDDR, and a PMOS region PMOS2 are arranged in an order in the Y direction, and an n-type tap region NTAPR extending in the X direction is arranged so as to overlap the power supply potential wiring region NDDR. The n-type tap region NTAPR is a power supply region for supplying a desired potential (a power supply potential or a negative voltage) to the n-type well region NW1.

The p-type well region PW2 and the n-type well region NW2 are also similar to the p-type well region PW1 and the n-type well region NW1. As shown in FIG. 3, the p-type well regions PW1 and PW2 and the n-type well regions NW1 and NW2 are adjacent to each other in the Y direction.

For example, a logic circuit having a CMOS (Complementary Metal Oxide Semiconductor) configuration is constituted by the p-type MISFET in the PMOS region PMOS1 and the n-type MISFET in the NMOS region NMOS1 sandwiched between the power supply potential wiring region VDDR and the reference potential wiring region VSSR.

Although FIG. 4 is a detailed plan view of the part A of FIG. 3, explanation for this drawing is omitted because FIG.

4 is similar to FIG. 1 explained above. In FIG. 5, a cross-sectional view taken along the line C-C of FIG. 4 is shown in a region CC, a cross-sectional view taken along the line D-D of FIG. 4 is shown in a region DD, a cross-sectional view taken along the line E-E of FIG. 4 is shown in a region EE, and a cross-sectional view taken along the line F-F of FIG. 4 is shown in the region FF. The region CC shows a cross-sectional view in the direction of the gate length of the n-type MISFET Qn1 (more specifically, a cross-sectional view of the NMOS region NMOS1), the region DD shows the p-type tap region PTAPR, the region EE shows a cross-sectional view in the direction of the gate length of the p-type MISFET Qp1 (more specifically, a cross-sectional view of the PMOS region PMOS1), and the region FF shows the n-type tap region NTAPR.

As shown in FIG. 5, the p-type MISFET Qp1 and the n-type tap region NTAPR are formed in the n-type well region NW1 provided on the main surface of the semiconductor substrate SB. The p-type MISFET Qp1 in the region EE is formed in an active region ACTP1 in the semiconductor layer SM formed on the main surface of the semiconductor substrate 1 via the insulating layer BX. The p-type MISFET Qp1 includes a gate electrode G1 formed on the semiconductor layer SM via a gate insulating film GF, and a source region and a drain region arranged on both side of the gate electrode G1. Each of the source region and the drain region is constituted by the p$^-$-type semiconductor region EXP and the p$^+$-type semiconductor region SDP. The p$^-$-type semiconductor region EXP is formed in the semiconductor layer SM. The p$^+$-type semiconductor region SDP is formed to extend from the semiconductor layer SM to the epitaxial layer EP formed on the semiconductor layer. A sidewall spacer SW2 is formed on a side wall of the gate electrode G1 via an insulating film IL1. The insulating film IL1 and the sidewall spacer SW2 can be collectively referred to as a sidewall spacer. The gate electrode G1 and the p+ type semiconductor region SDP are isolated or spaced part from each other by the sidewall spacer. The p$^-$-type semiconductor region EXP is formed below the sidewall spacer.

The epitaxial layer EP is formed in a region defined by the sidewall spacer and the element isolation region STI, and a silicide layer (metal silicide layer) SL is formed on the main surface of the epitaxial layer EP (in other words, the main surface of the p+ type semiconductor region SDP). In addition, the silicide layer SL is formed on the main surface of the gate electrode G1. The silicide layer SL in each of the source region and the drain region is connected via the plug electrode PG to the wiring M1.

Below the channel formation region located in the semiconductor layer SM between the pair of p$^-$-type semiconductor regions EXP, an n-type semiconductor region GN is formed on the main surface in the n-type well region NW1 via the insulating layer BX. The n-type semiconductor region GN is a region for adjusting a threshold value of the p-type MISFET Qp1.

In the active region ACTNT surrounded by the element isolation regions STI in the n-type tap region NTAPR (the region FF), an n$^+$-type semiconductor region SDN is formed on the main surface of the n-type well region NW1, and a silicide layer SL is formed on the main surface of the n$^+$-type semiconductor region SDN. The n-type well region NW1 is connected to the power supply potential wiring VDD via the plug electrode PG that is in contact with the silicide layer SL. More specifically, the power supply potential supplied from the power supply potential wiring VDD is supplied to the n-type well region NW1 via the plug electrode PG, the silicide layer SL, and the n$^+$-type semiconductor region SDN.

As shown in FIG. 5, the epitaxial layer EP is not formed on the main surface of the n-type well region NW1. Therefore, as different from the related art explained above, the n$^+$-type semiconductor region SDN does not lie on the dent DT in the element isolation region STI. Therefore, the n$^+$-type semiconductor region SDN is not close to the gate electrode G1 or G2, so that the short circuit or the breakdown voltage deterioration between the gate electrode G1 or G2 and the n-type well region NW1 can be prevented.

In the n-type tap region NTAPR in the present first embodiment, the epitaxial layer EP is not formed on the main surface of the n-type well region NW1 (in other words, semiconductor substrate SB). Therefore, as shown in FIG. 5, the present first embodiment has a feature in which a level of the lower surface of the silicide layer SL in the active region ACTNT (which can also be referred to as an interface between the silicide layer SL and the n$^+$-type semiconductor region SDN) is equal to that of the lower surface of the insulating layer BX in the active region ACTP1 (which can also be referred to as an interface between the insulating layer BX and the semiconductor layer GN or the n-type well region NW1) or is lower than the same by d1 (is closer to the back surface of the semiconductor substrate SB). This is because a part of the semiconductor substrate SB reacts with the metal film for forming the silicide layer SL during formation of the silicide layer SL in the case of no formation of the epitaxial layer EP, which results in recession (lowering) from an original level of the main surface. Here, the back surface of the semiconductor substrate SB is a surface opposite to the main surface on which the n-type well region NW1 (or the element isolation region STI) is formed.

As shown in FIG. 5, the n-type MISFET Qn1 and the p-type tap region PTAPR are formed in the p-type well region PW1 provided on the main surface of the semiconductor substrate SB. The structure of the n-type MISFET Qn1 in the region CC is similar to that of the p-type MISFET Qp1 explained above, and the explanation about the p-type MISFET Qp1 can be reused. However, each of the source region and the drain region of the n-type MISFET Qn1 is constituted by an n$^-$-type semiconductor region EXN and an n$^+$-type semiconductor region SDN. Below the channel formation region located in the semiconductor layer SM between the pair of n$^-$-type semiconductor regions EXN, a p-type semiconductor region GP is formed on the main surface in the p-type well region PW1 via the insulating layer BX. The p-type semiconductor region GP is a region for adjusting a threshold value of the n-type MISFET Qn1.

In the active region ACTPT surrounded by the element isolation regions STI in the p-type tap region PTAPR (the region DD), a p$^+$-type semiconductor region SDP is formed to extend from the main surface of the p-type well region PW1 to the epitaxial layer EP formed on the main surface of the p-type well region PW1, and a silicide layer SL is formed on the main surface of the p$^+$-type semiconductor region SDP. The p-type well region PW1 is connected to the reference potential wiring VSS via the plug electrode PG that is in contact with the silicide layer SL. In the p-type tap region PTAPR, as different from the n-type tap region NTAPR, the epitaxial layer EP is formed on the p-type well region PW1. Although described later, this is because of the fact that the inventors of the present application has found that the dent DT in the element isolation region STI is more difficult to occur in the p-type tap region PTAPR than the n-type tap region NTAPR. Note that illustration of the dent DT in the element isolation region STI in the p-type tap region PTAPR is omitted. More specifically, the dent DT in the element isolation region STI in the p-type tap region PTAPR is smaller than the dent DT in the element isolation region STI in the n-type tap region NTAPR.

Therefore, as shown in FIG. 5, the present first embodiment has a feature in the p-type tap region PTAPR in which a level of the lower surface of the silicide layer SL in the active region ACTPT (the lower surface can also be referred to as an interface between the silicide layer SL and the $p^+$-type semiconductor region SDP) is higher than that of the lower surface of the insulating layer BX in the active region ACTN1 (the lower surface can also be referred to as an interface between the insulating layer BX and the semiconductor layer GP) by d2 (is farther to the back surface of the semiconductor substrate SB). By this structure, the depth of the plug electrode PG in the p-type tap region PTAPR (in other words, an aspect ratio of the plug electrode PG or an aspect ratio of the opening formed in an insulating film SZ1) can be reduced.

Note that each of the power supply potential wiring VDD and the reference potential wiring VSS is referred to as a power supply wiring in terms of a generic concept in some cases.

Obviously, the p-type tap region PTAPR can be formed to have a structure similar to the n-type tap region NTAPR without the formation of the epitaxial layer EP on the p-type well region PW1. More specifically, the silicide layer SL may be formed on the surface of the p-type well region PW1 without intervening the epitaxial layer EP.

<Regarding Steps of Manufacturing Semiconductor Device According to First Embodiment>

The steps of manufacturing the semiconductor device according to the present first embodiment will be explained with reference to the drawings. FIG. 6 to FIG. 18 are cross-sectional views in steps of manufacturing the semiconductor device according to the present first embodiment. FIG. 6 to FIG. 18 correspond to the region CC, the region DD, the region EE and the region FF shown in FIG. 5.

First, an SOI (Silicon On Insulator) substrate 1 is prepared. The SOI substrate 1 includes a semiconductor substrate (support substrate) SB serving as a support substrate, an insulating layer (buried insulating film) BX formed on the main surface of the semiconductor substrate SB, and a semiconductor layer SM formed on the upper surface of the insulating layer BX.

The semiconductor substrate SB is a support substrate for supporting the insulating layer BX and the structure above the insulating layer BX, but is also a semiconductor substrate. The semiconductor substrate SB is preferably a monocrystalline silicon substrate and is made of, for example, p-type monocrystalline silicon. The insulating layer BX is preferably a silicon oxide film, and the thickness of the insulating layer BX can be set to, for example, about 10 to 30 nm. The semiconductor layer SM is made of monocrystalline silicon or others, and the thickness of the semiconductor layer SM can be set to, for example, about 5 to 25 nm. The SOI substrate 1 is formed by the semiconductor substrate SB, the insulating layer BX, and the semiconductor layer SM.

In the SOI substrate 1, a main surface which is one of the main surfaces of the semiconductor substrate SB and which is in contact with the insulating layer BX will be referred to as an upper surface of the semiconductor substrate SB, and a main surface which is another one of the main surfaces and which is opposite to the upper surface of the semiconductor substrate SB will be referred to as a back surface of the semiconductor substrate SB. In the SOI substrate 1, a main surface which is one of the main surfaces of the insulating layer BX and which is in contact with the semiconductor substrate SB will be referred to as a lower surface of the insulating layer BX, another main surface which is in contact with the semiconductor layer SM will be referred to as an upper surface of the insulating layer BX, and the upper and lower surfaces of the insulating layer are surfaces opposite to each other. A main surface which is one of the main surfaces of the semiconductor layer SM and which is in contact with the insulating layer BX will be referred to as a lower surface of the semiconductor layer SM, and another main surface which is opposite to the lower surface of the semiconductor layer SM will be referred to as an upper surface of the semiconductor layer SM.

Subsequently, an insulating film (pad insulating film) ZM1 is formed on the main surface of the SOI substrate 1, i.e., on the upper surface of the semiconductor layer SM. The insulating film ZM1 is made of the same material as the insulating layer BX. When the insulating layer BX is made of silicon oxide, the insulating film ZM1 is also made of silicon oxide. The insulating film ZM1 can be formed by using, for example, a CVD (Chemical Vapor Deposition) method or others.

Subsequently, the insulating film ZM2 is formed on the insulating film ZM1. The insulating film ZM2 is made of a material different from that of the insulating film ZM1. When each of the insulating layer BX and the insulating film ZM1 is made of silicon oxide, the insulating film ZM2 is preferably made of silicon nitride. In addition, the insulating film ZM2 is also made of a material different from that of the insulating film ZM3 to be described later. The insulating film ZM2 can be formed by using, for example, the CVD method or others. The formation film thickness of the insulating film ZM2 can be set to, for example, about 80 to 120 nm.

Figure 6:
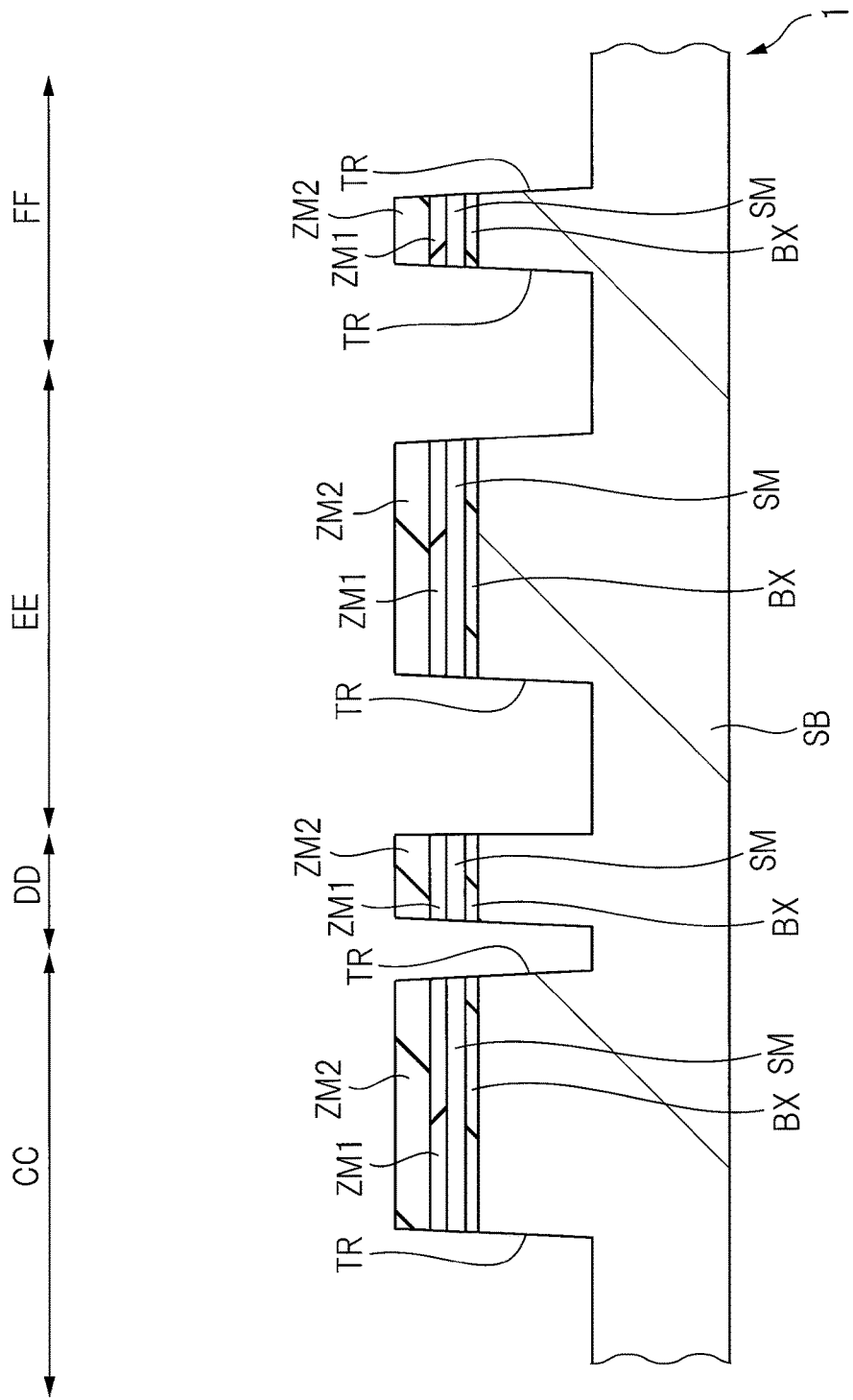
FIG. 6 is a cross-sectional view illustrating the semiconductor device in a step of manufacturing the semiconductor device according to the first embodiment.

Subsequently, as shown in FIG. 6, a trench TR is formed. The trench TR is a trench for forming an element isolation region STI described later, i.e., a trench for element isolation.

The trench TR can be formed as follows. More specifically, first, a photoresist layer (not shown) is formed on the insulating film ZM2 by a photolithography technique. This photoresist layer has such a pattern (planar shape) as exposing the insulating film ZM2 in a region where the trench TR is formed at a later step and as covering the insulating film ZM2 in other regions. Then, the insulating film ZM2 is etched (preferably dry etched) and is patterned while using this photoresist layer as an etching mask. In this manner, the insulating film ZM2 in the region where the trench TR is formed at a later step can be selectively removed. Then, this photoresist layer is removed, and then, the insulating film ZM1, the semiconductor layer SM, the insulating layer BX, and the semiconductor substrate SB are etched (preferably dry etched) while using the insulating film ZM2 as an etching mask (hard mask), so that the trench TR can be formed.

The trench TR penetrates through the insulating film ZM2, the insulating film ZM1, the semiconductor layer SM, and the insulating layer BX so that a bottom portion (bottom surface) of the trench TR reaches the semiconductor substrate SB. More specifically, the bottom portion (bottom surface) of the trench TR is located at a position in the middle of the thickness of the semiconductor substrate SB. For this reason, the bottom surface of the trench TR is lower than the lower surface of the insulating layer BX so that the semiconductor substrate SB is exposed at the bottom portion of the trench TR. The depth of the trench TR can be set to, for example, about 250 to 300 nm.

Subsequently, an insulating film is formed on the insulating film ZM2 so as to fill the trench TR. The insulating film is an insulating film for forming the element isolation region STI, and is preferably a silicon oxide film. Therefore, the insulating film for forming the STI, the insulating film ZM1, and the insulating layer BX are made of the same material as one another, and all of them are preferably made of silicon oxide. The insulating film can be formed by a CVD method or others. The formation film thickness of the insulating film is preferably set to a thickness that is large enough to bury (fill) the trench TR with the insulating film.

Figure 7:
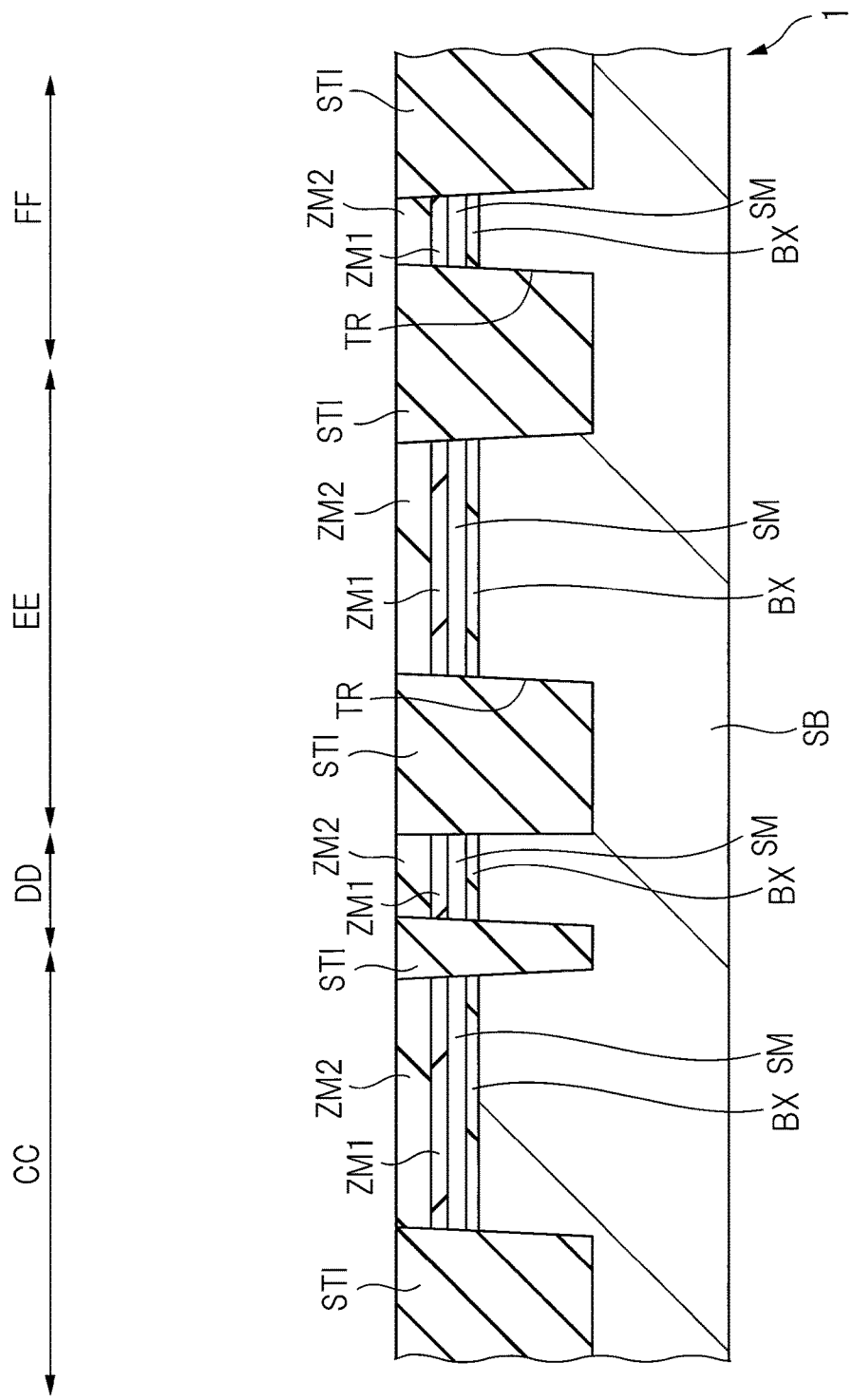
FIG. 7 is a cross-sectional view in a step of manufacturing the semiconductor device, continued from FIG. 6.

Subsequently, as shown in FIG. 7, the insulating film is polished (in a polishing process) by using a CMP (Chemical Mechanical Polishing) method or others, so that the insulating film outside the trench TR is removed, and the insulating film inside is left inside the trench TR. In this manner, as shown in FIG. 7, the element isolation region (element isolation structure) STI configured of the insulating film buried in the trench TR can be formed. The element isolation region STI is formed inside the trench TR.

During this polishing process, the insulating film ZM2 functions as a polishing stopper film. More specifically, the polishing process is performed under a condition under which the insulating film ZM2 is more difficult to be polished than the insulating film. At a stage of end of the polishing process, the upper surface of the insulating film ZM2 is exposed, and the element isolation region STI is buried inside the trench TR, so that a level of the upper surface of the element isolation region STI is located at substantially the same height level as the upper surface of the insulating film ZM2.

Subsequently, the insulating film ZM2 is etched and removed to expose the upper surface of the insulating film ZM1. A wet etching process can be suitably used for etching of the insulating film ZM2. When the insulating film ZM2 is made of silicon nitride while each of the insulating film ZM1 and the element isolation region STI is made of silicon oxide, hot phosphoric acid (heated phosphoric acid) is preferably used as an etching solution used for the etching of the insulating film ZM2.

In this manner, the element isolation region STI having the STI structure is formed by using a shallow trench isolation (STI) method. At a stage of the preparation of the SOI substrate 1, the semiconductor layer SM is formed on the entire upper surface of the semiconductor substrate SB via the insulating layer BX. When the element isolation region STI is formed, the semiconductor layer SM is partitioned into a plurality of regions (active regions) each of which is surrounded by the element isolation regions STI.

Figure 8:
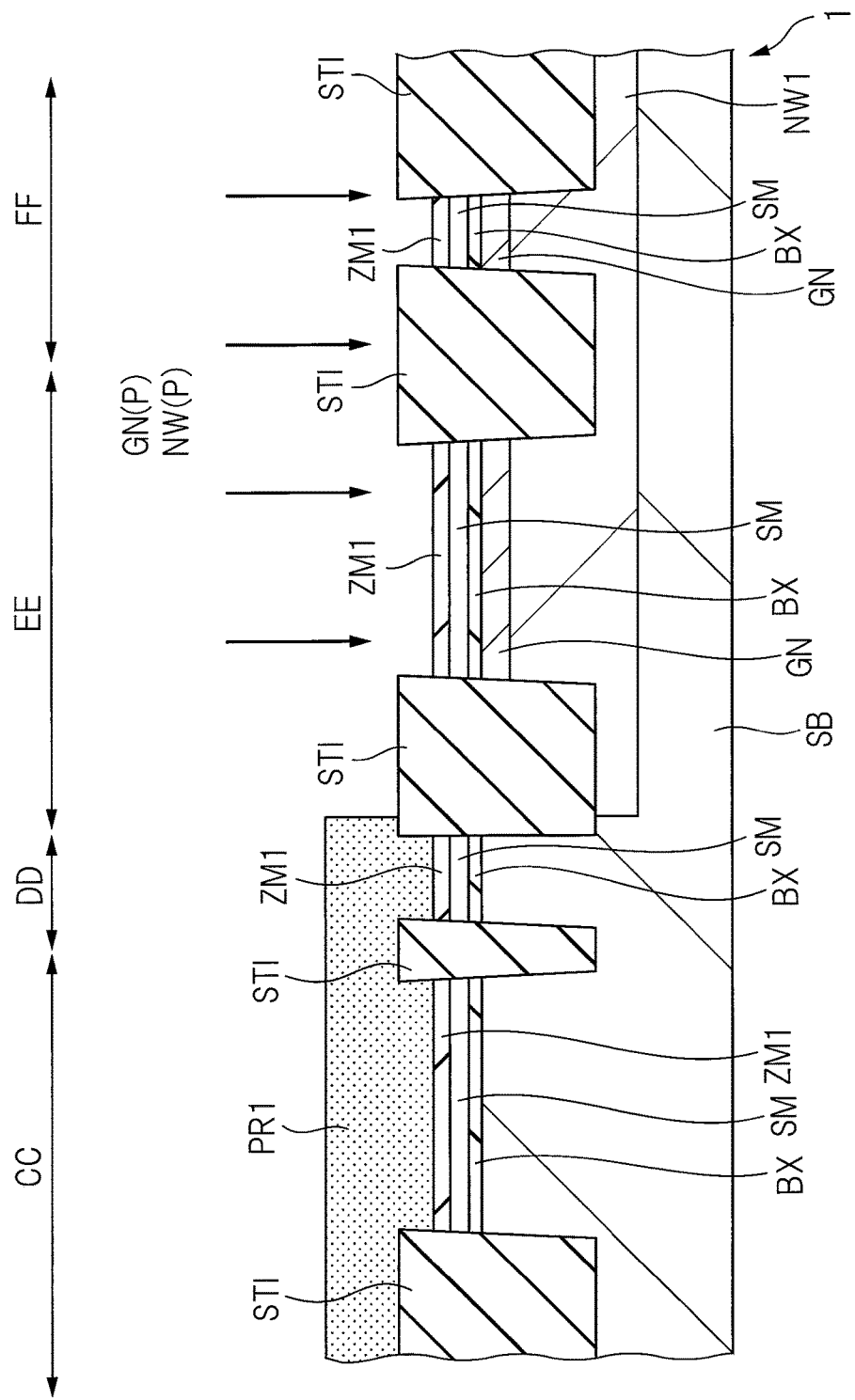
FIG. 8 is a cross-sectional view in a step of manufacturing the semiconductor device, continued from FIG. 7.

Subsequently, as shown in FIG. 8, a photoresist layer PR1 is formed as a mask layer on the SOI substrate 1 by using a photolithography technique. The photoresist layer PR1 covers the NMOS region NMOS1 (the region CC) and the p-type tap region PTAPR (the region DD), and exposes the PMOS region PMOS1 (the region EE) and the n-type tap region NTAPR (the region FF). The side surface (inner wall) of the photoresist layer PR1 is located on the element isolation region STI.

Subsequently, ion implantation for forming the n-type well region NW1 and the semiconductor region GN is performed while using the photoresist layer PR1 as the mask (ion implantation blocking mask) and using, for example, phosphorus ions or arsenic ions as impurities for the semiconductor substrate SB of the SOI substrate 1. The n-type well region NW1 is formed from the main surface of the semiconductor substrate SB so as to be deeper than the bottom portion of the element isolation region STI. The semiconductor region GN is formed in a part of the main surface of the semiconductor substrate SB surrounded by the element isolation regions STI, the part being formed immediately below the insulating layer BX. Since the impurity concentration of the semiconductor region GN is higher than the impurity concentration of the n-type well region NW1, impurities with a higher concentration are ion-implanted in order to form the semiconductor region GN. As a modification example, note that the semiconductor region GN may be formed only in the PMOS region PMOS1 (the region EE) by using a photoresist layer that selectively exposes the PMOS region PMOS1 (the region EE).

Figure 9:
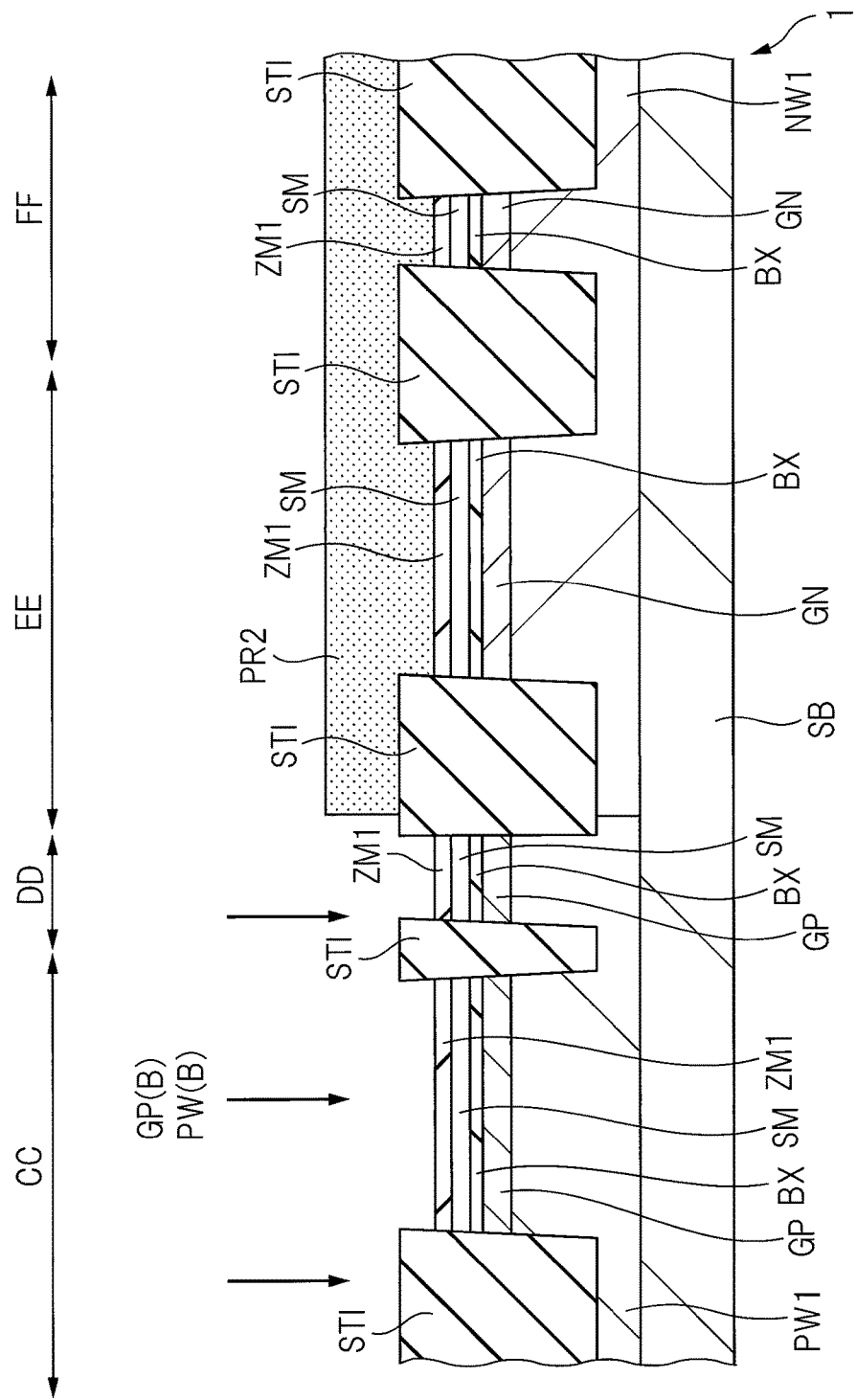
FIG. 9 is a cross-sectional view in a step of manufacturing the semiconductor device, continued from FIG. 8.

Subsequently, as shown in FIG. 9, a photoresist layer PR2 is formed on the SOI substrate 1 as a mask layer. The photoresist layer PR2 covers the PMOS region PMOS1 (in the region EE) and the n-type tap region NTAPR (the region FF), and exposes the NMOS region NMOS1 (the region CC) and the p-type tap region PTAPR (the region DD). The side surface (inner wall) of the photoresist layer PR2 is located on the element isolation region STI.

Subsequently, ion implantation for forming the p-type well region PW1 and the semiconductor region GP is performed while using the photoresist layer PR2 as the mask (ion implantation blocking mask) and using, for example, boron ions as impurities for the semiconductor substrate SB of the SOI substrate 1. The p-type well region PW1 is formed from the main surface of the semiconductor substrate SB so as to be deeper than the bottom portion of the element isolation region STI. The semiconductor region GP is formed in a part of the main surface of the semiconductor substrate SB surrounded by the element isolation regions STI, the part being formed immediately below the insulating layer BX. Since the impurity concentration of the semiconductor region GP is higher than the impurity concentration of the p-type well region PW1, impurities with a higher concentration are ion-implanted in order to form the semiconductor region GP. As a modification example, note that the semiconductor region GP may be formed only in the NMOS region NMOS1 (the region CC) by using a photoresist layer that selectively exposes the NMOS region NMOS1 (the region CC).

Figure 10:
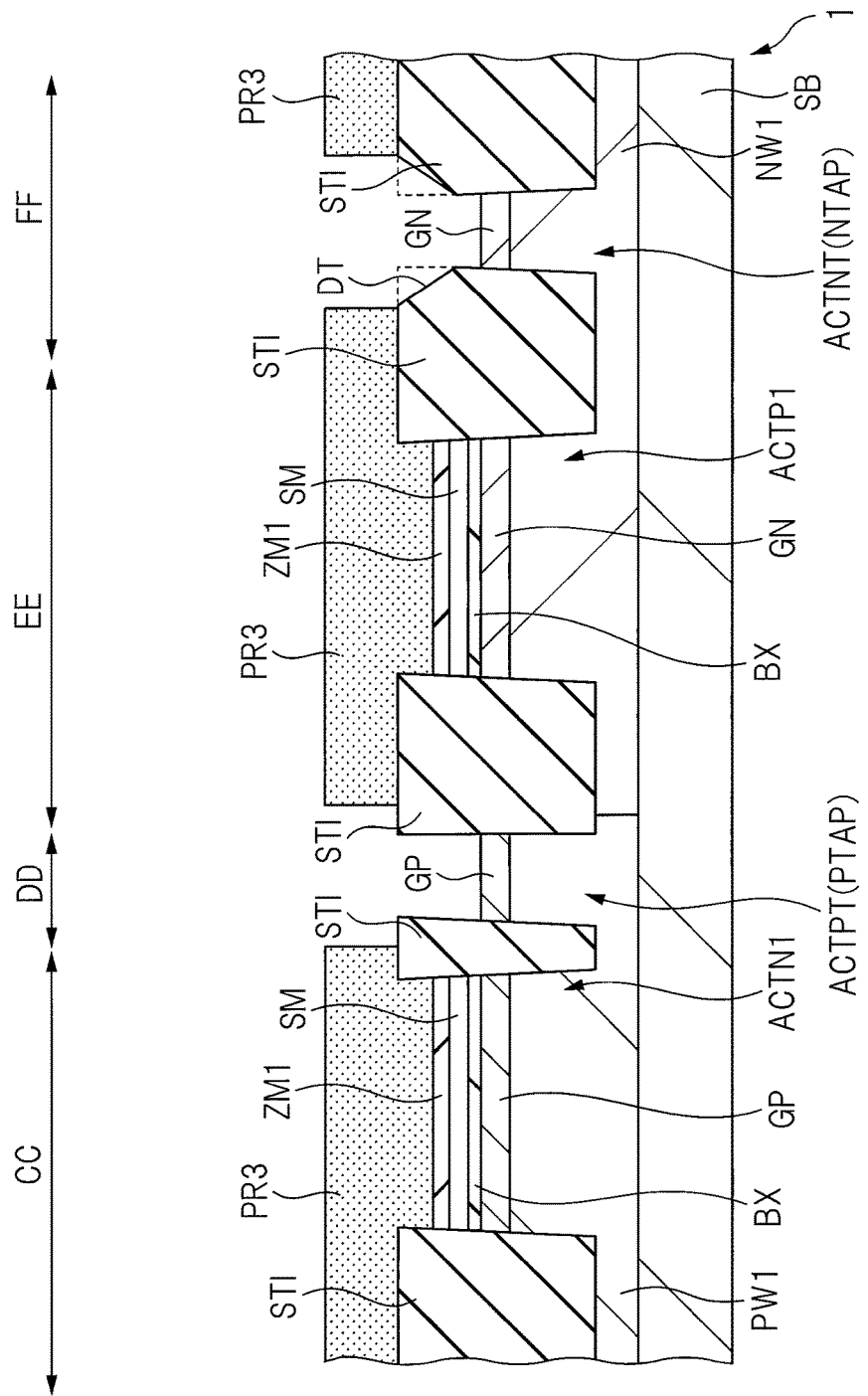
FIG. 10 is a cross-sectional view in a step of manufacturing the semiconductor device, continued from FIG. 9.

Subsequently, as shown in FIG. 10, a photoresist layer PR3 is formed on the SOI substrate 1 as a mask layer. The photoresist layer PR3 covers the NMOS region NMOS1 (the region CC) and the PMOS region PMOS1 (the region EE), and exposes the p-type tap region PTAPR (the region DD) and the n-type tap region NTAPR (the region FF). The side surface (inner wall) of the photoresist layer PR2 is located on the element isolation region STI.

Subsequently, the insulating film ZM1, the semiconductor layer SM, and the insulating layer BX in the p-type tap region PTAPR and the n-type tap region NTAPR are removed by using an etchant such as hydrofluoric acid while using the photoresist layer PR3 as a mask (ion implantation blocking mask), so that the main surface of the semiconductor substrate SB is exposed. In this etching step, as shown in FIG. 10, the inventors of the present application has found that the shoulder portion of the element isolation region STI exposed from the photoresist layer PR3 in the n-type tap region NTAPR (the region FF) is etched to cause a large dent DT in the element isolation region STI. In the p-type tap region PTAPR (the region DD), while the shoulder portion of the element isolation region STI is also slightly etched, the dent DT as large as the dent in the n-type tap region NTAPR (the region FF) is not formed. Note that the illustration of the dent DT in the p-type tap region PTAPR (the region DD) is omitted.

A cause of the occurrence of the dent DT is the ion implantation of phosphorus ions or arsenic ions having a relatively large mass at a high energy also into the element isolation regions STI surrounding the active region ACTNT in the n-type tap region NTAPR (the region FF) in the step of forming the n-type well region NW1 or the semiconductor region GN explained above. Furthermore, this is because the silicon oxide film constituting the element isolation region STI in the region to which the phosphorus ions or the arsenic ions having the relatively large mass have been ion-implanted at the high energy is weakened (or deteriorated) and is easily etched by the above-described etchant. On the other hand, in the step of forming the p-type well region PW1 and the semiconductor region GP explained above, boron ions area also ion-implanted into the element isolation regions STI surrounding the active region ACTPT in the p-type tap region PTAPR (the region DD). However, since the mass of boron ion is relatively small, the weakness (deterioration) of the silicon oxide film constituting the element isolation region STI is reduced. Therefore, the dent DT as large as that in the n-type tap region NTAPR (the region FF) is not formed in the element isolation region STI in the p-type tap region PTAPR (the region DD).

Figure 11:
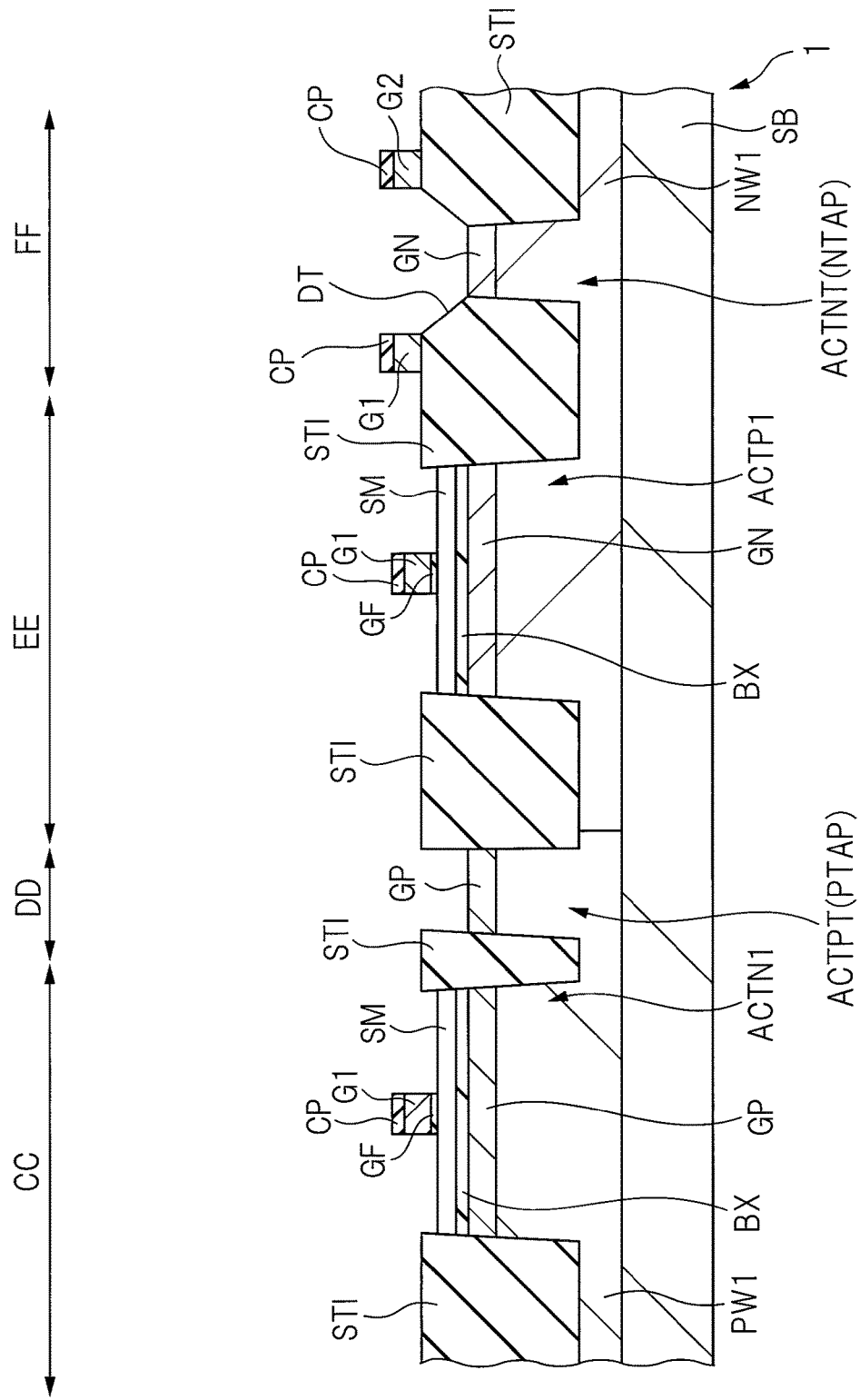
FIG. 11 is a cross-sectional view in a step of manufacturing the semiconductor device, continued from FIG. 10.

Subsequently, as shown in FIG. 11, the gate insulating film GF and the gate electrode G1 are formed in the NMOS region NMOS1 (the region CC) and in the PMOS region PMOS1 (the region EE). In this step, the gate electrodes G1 and G2 are formed on the element isolation region STI in the n-type tap region NTAPR (the region FF).

First, the surface of the semiconductor layer SM is cleaned by a cleaning process (wet etching process for cleaning) as needed, and then, a gate insulating film GF is formed on the surface of the semiconductor layer SM. The gate insulating film GF is made of a silicon oxide film or others, and can be formed by a thermal oxidation method or others.

Subsequently, a silicon film such as a polysilicon film is formed as a conductive film for forming the gate electrode on the main surface of the SOI substrate 1, i.e., on the gate insulating film GF and the element isolation region STI, and then, an insulating film such as a silicon nitride film is formed on the silicon film.

Subsequently, as shown in FIG. 11, the insulating film and the silicon film are patterned by a photolithography technique and a dry etching technique to form a laminated body made of the gate electrodes G1 and G2 and a cap insulating film CP located on the gate electrodes G1 and G2.

Note that the step of removing the insulating film ZM1 and the step of forming the gate insulating film GF include many steps by which the upper surface of the element isolation region STI is etched, and therefore, FIG. 11 shows the upper surface of the element isolation region STI to be lower than that in FIG. 10.

Figure 12:
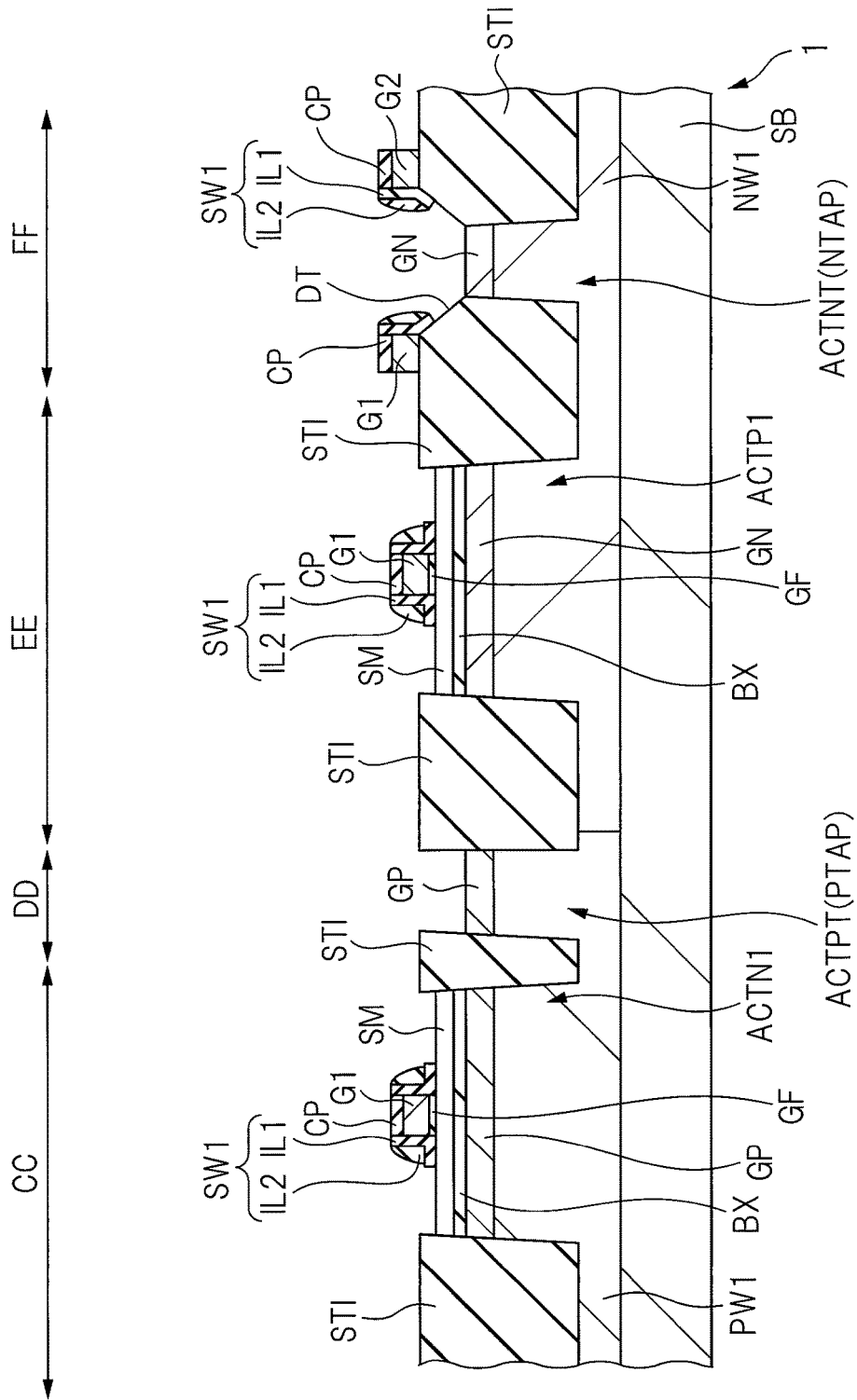
FIG. 12 is a cross-sectional view in a step of manufacturing the semiconductor device, continued from FIG. 11.

Subsequently, as shown in FIG. 12, the sidewall spacer SW1 is formed on a side surface of the laminated body as a sidewall insulating film.

In the step of forming the sidewall spacer SW1, first, a laminated film made of an insulating film IL1 and an insulation film IL2 on the insulating film IL1 is formed on the entire main surface of the SOI substrate 1 including the element isolation region STI so as to cover the laminated body. The insulating film IL1 and the insulating film IL2 are made of different materials from each other. Preferably, the insulating film IL1 is made of a silicon oxide film, and the insulating film IL2 is made of a silicon nitride film. Then, the sidewall spacers SW1 are formed on both side surfaces of the laminated body by etching back the laminated film of the insulating film IL1 and the insulating film IL2 by an anisotropic etching technique. The sidewall spacer SW1 is made of a laminated film formed of the insulating film IL1 and the insulating film IL2. More specifically, the sidewall spacer SW1 is made of the insulating film IL1 continuously extending from the semiconductor layer SM to the side surface of the laminated body with an almost uniform thickness and the insulating film IL2 spaced apart from the semiconductor layer SM and the laminated body via the insulating film IL1 Note that the sidewall spacers SW1 are practically formed on both sides of the gate electrodes G1 and G2 on the element isolation region STI. However, for the simplicity of the explanation, only one sidewall spacer closer to the n-type tap NTAP is shown, and the other opposite one is not shown.

Figure 13:
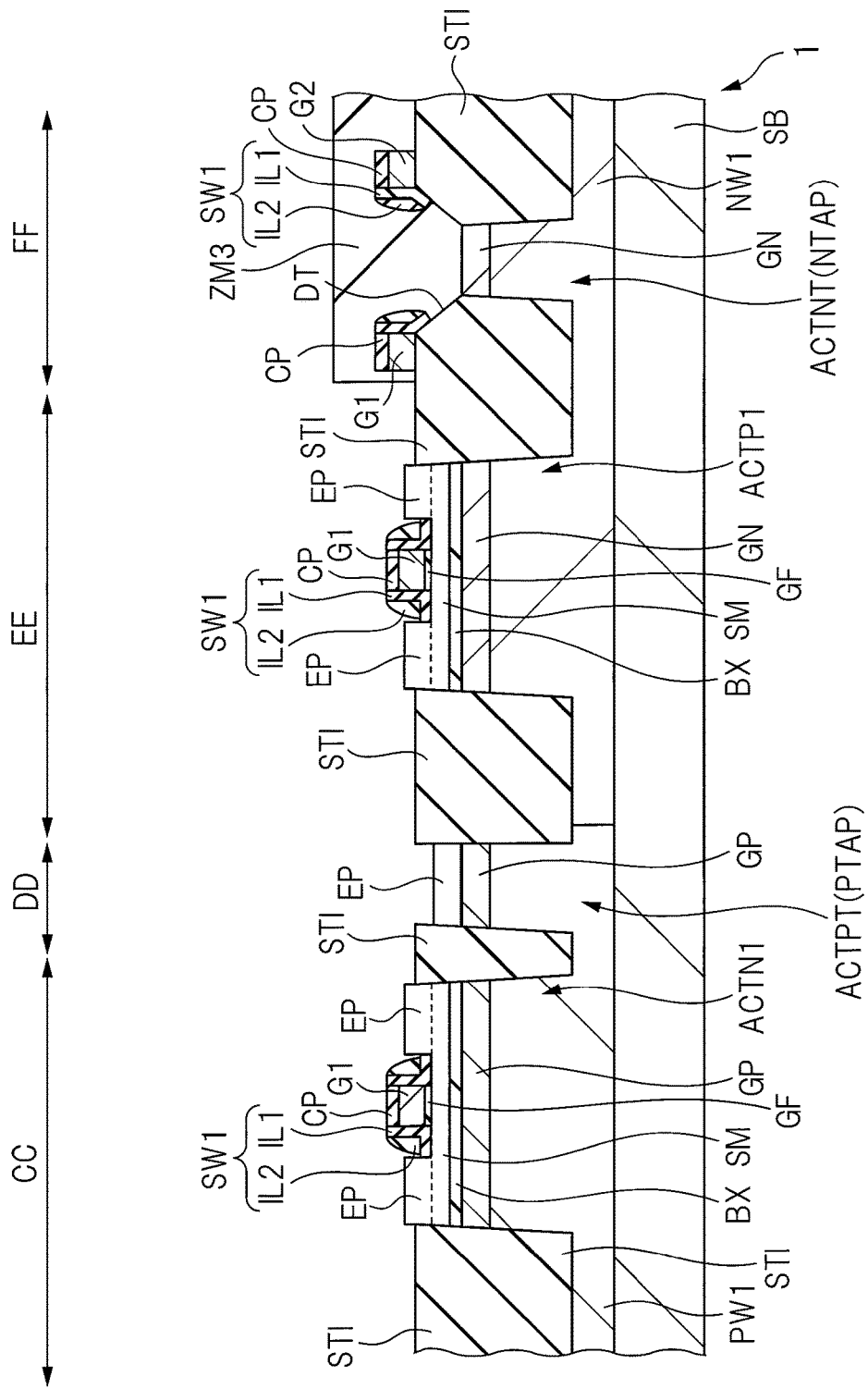
FIG. 13 is a cross-sectional view in a step of manufacturing the semiconductor device, continued from FIG. 12.

Subsequently, as shown in FIG. 13, an epitaxial layer EP is formed on the semiconductor layer SM of the SOI substrate 1 by epitaxial growth. The epitaxial layer EP is formed in the NMOS region NMOS1, the p-type tap region PTAPR, and the PMOS region PMOS1. The n-type tap region NTAPR (the region FF) is covered with the insulating film ZM3, and the epitaxial layer EP is not formed in the n-type tap region NTAPR.

The epitaxial layer EP is an epitaxial layer formed by epitaxial growth, and is made of, for example, monocrystalline silicon. Since the epitaxial layer EP is formed by epitaxial growth, the crystal structure of the semiconductor layer SM or the semiconductor substrate SB that is a base is reflected on the crystal structure of the epitaxial layer EP. The crystal structure of the epitaxial layer EP is the same as the crystal structure of the semiconductor layer SM or the semiconductor substrate SB.

Since the epitaxial layer EP is formed by epitaxial growth, the epitaxial layer (epitaxial layer EP) is selectively grown on the exposed surface (Si surface) of the semiconductor layer SM, and no epitaxial layer is grown on the insulating film. Therefore, the epitaxial layer EP is selectively grown on a region (exposed surface) of the surface of the semiconductor layer SM, the region being not covered with the laminated body and the sidewall spacer SW1. Therefore, the epitaxial layer EP is formed on both sides of a structure body on the semiconductor layer SM, the structure body being formed of the laminated body and the sidewall spacer SW1. More specifically, the epitaxial layer EP is formed on both sides of the gate electrode G1 and the sidewall spacers SW1 in the NMOS region NMOS1 and the PMOS region PMOS1. Furthermore, in the p-type tap region PTAPR, the epitaxial layer EP is formed on the main surface of the semiconductor substrate SB (i.e., on the p-type well region PW1 or the semiconductor region GP). The upper surface of the gate electrode G1 is covered with the cap insulating film CP, and the side surface of the gate electrode G1 is covered with the sidewall spacer SW1, and therefore, the epitaxial layer (epitaxial layer EP) is not formed on the gate electrode G1. Since the element isolation region STI is formed of the insulating body (insulating film), the epitaxial layer (epitaxial layer EP) is not grown (not formed) on the element isolation region STI.

Subsequently, the insulating film IL2 forming the sidewall spacer SW1 is removed by etching. At this stage, the insulating film IL2 is an insulating film different from the insulating film IL1, and therefore, the insulating film IL2 can be selectively removed. In the step of removing the insulating film IL2, the cap insulating film CP on the gate electrodes G1 and G2 is also removed. Since the cap insulating film CP is formed as an insulating film made of the same material as that of the insulating film IL2, the sidewall spacer SW1 and the cap insulating film CP can be removed in the same step.

Figure 14:
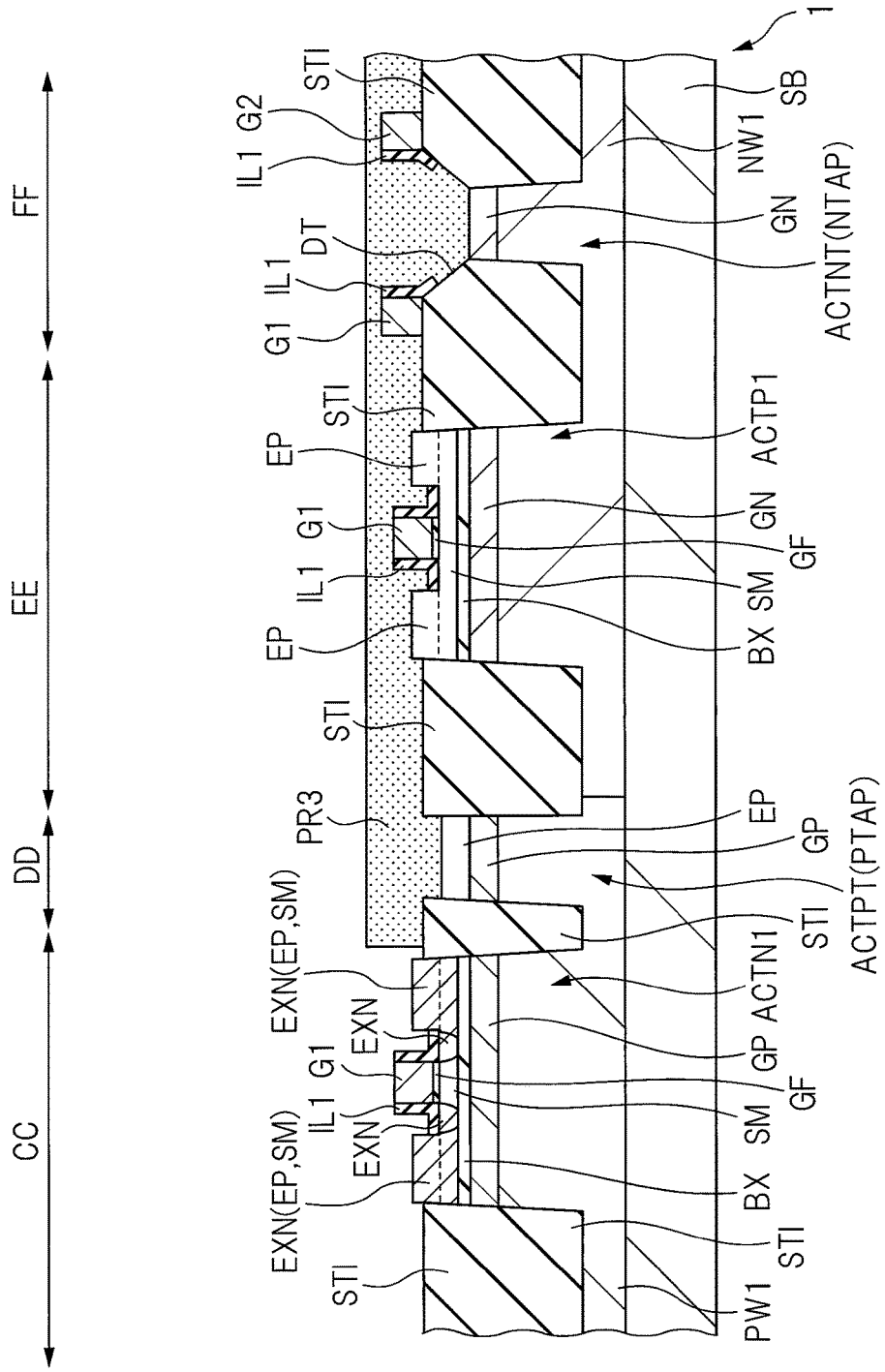
FIG. 14 is a cross-sectional view in a step of manufacturing the semiconductor device, continued from FIG. 13.

Subsequently, as shown in FIG. 14, a photoresist layer PR3 is formed on the SOI substrate 1 as mask layer. The photoresist layer PR3 covers the p-type tap region PTAPR (the region DD), the PMOS region PMOS1 (the region EE), and the n-type tap region NTAPR (the region FF), and exposes the NMOS region NMOS1 (the region CC). An n$^-$-type semiconductor region (extension region) EXN is formed by ion-implanting n-type impurities such as phosphorous (P) or arsenic (As) into regions on both sides of the gate electrode G1 in the semiconductor layer SM and the epitaxial layer EP. The n$^-$-type semiconductor region EXN is formed on both sides of the gate electrode G1 (that is, below the insulating film L1) in the semiconductor layer SM. Furthermore, the n$^-$-type semiconductor region EXN is formed over the epitaxial layer EP and the semiconductor layer SM below the epitaxial layer.

Figure 15:
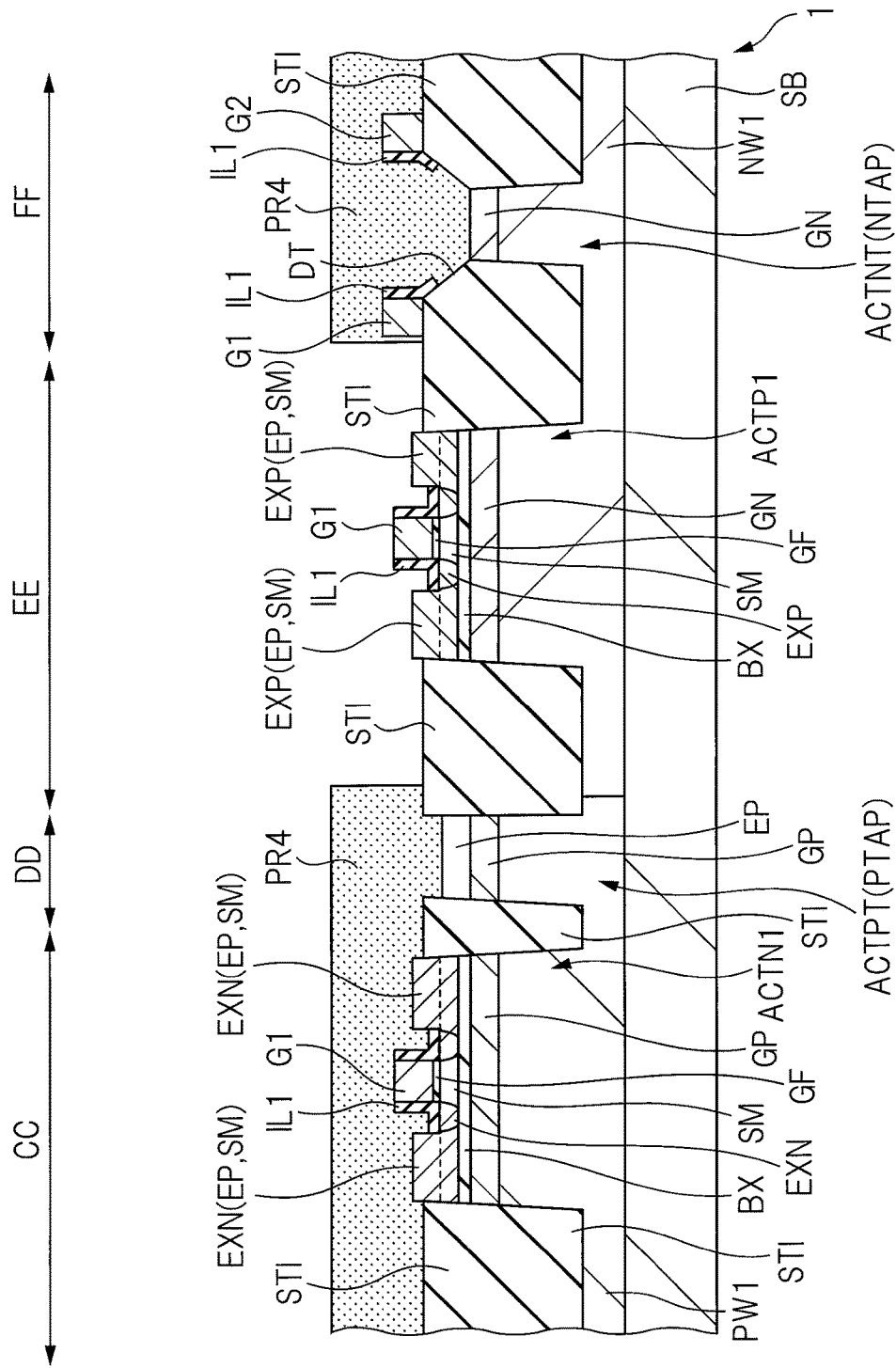
FIG. 15 is a cross-sectional view in a step of manufacturing the semiconductor device, continued from FIG. 14.

Subsequently, as shown in FIG. 15, a photoresist layer PR4 is formed on the SOI substrate 1 as mask layer. The photoresist layer PR4 covers the NMOS region NMOS1 (the region CC), the p-type tap region PTAPR (the region DD), and the n-type tap region NTAPR (the region FF), and exposes the PMOS region PMOS1 (the region EE). A p$^-$-type semiconductor region (extension region) EXP is formed by ion-implanting p-type impurities such as boron (B) into regions on both sides of the gate electrode G1 in the semiconductor layer SM and the epitaxial layer EP. The p$^-$-type semiconductor region EXP is formed on both sides of the gate electrode G1 (that is, below the insulating film L1) in the semiconductor layer SM. Furthermore, the p$^-$-type semiconductor region EXP is formed over the epitaxial layer EP and the semiconductor layer SM below the epitaxial layer.

Figure 16:
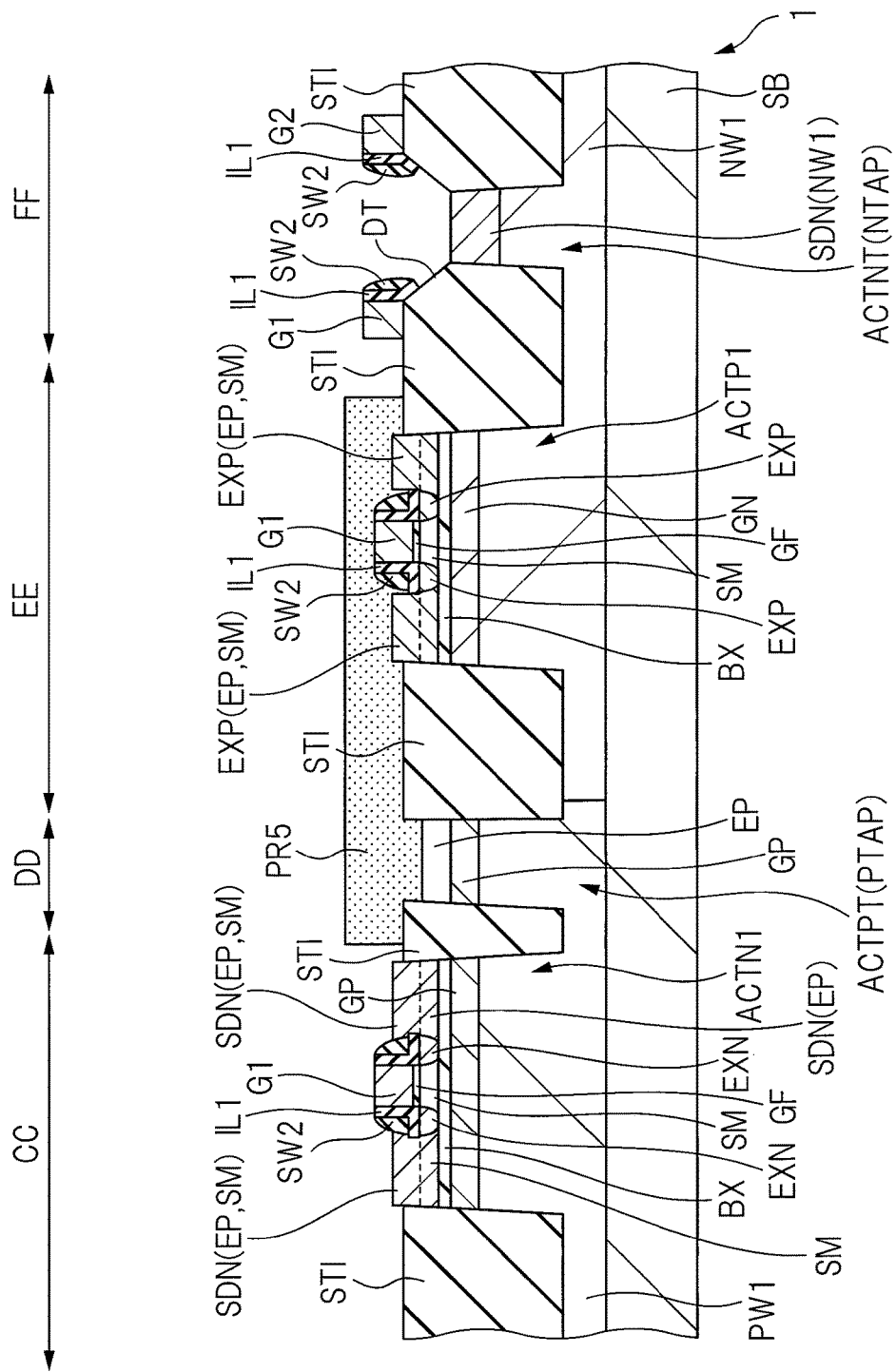
FIG. 16 is a cross-sectional view in a step of manufacturing the semiconductor device, continued from FIG. 15.

Subsequently, as shown in FIG. 16, the sidewall spacer SW2 is formed on the side surface of each of the gate electrodes G1 and G2 as a sidewall insulating film.

In the step of forming the sidewall spacer SW2, an insulating film (for example, a silicon nitride film) for forming the sidewall spacer SW2 is formed on the entire main surface of the SOI substrate 1 including the element isolation region STI so as to cover the gate electrodes G1 and G2 and the insulation film IL1. Subsequently, the sidewall spacer SW2 can be formed on the side surface of each of the gate electrodes G1 and G2 by etching back this insulating film with the use of an anisotropic etching technique. The sidewall spacer SW2 is formed on both side surfaces of each of the gate electrodes G1 and G2 via the insulating film IL1 For simplicity of explanation, note that only the sidewall spacer SW2 on one side of each of the gate electrodes G1 and G2 is shown in the region FF.

Subsequently, a photoresist layer PR5 is formed on the SOI substrate 1 as mask layer. The photoresist layer PR5 covers the p-type tap region PTAPR (the region DD) and the PMOS region PMOS1 (the region EE), and exposes the NMOS region NMOS1 (the region CC) and the n-type tap region NTAPR (the region FF).

The n$^+$-type semiconductor region (source/drain region) SDN is formed by the ion implantation of n-type impurities such as phosphorus (P) or arsenic (As) into the regions on both sides of a portion formed of the gate electrode G1 and the sidewall spacer SW2 in the semiconductor layer SM and the epitaxial layer EP of the SOI substrate 1 in the NMOS region NMOS1 (the region CC). In the ion implantation for forming the n$^+$-type semiconductor region SDN, the gate electrode G1 and the sidewall spacers SW2 on both sides of the gate electrode can function as an ion implantation blocking mask. The n$^+$-type semiconductor region SDN has a higher impurity concentration than that of the n$^-$-type semiconductor region EXN.

In the n-type tap region NTAPR (the region FF), the n$^+$-type semiconductor region SDN is formed on the semiconductor substrate SB (or the n-type well region NW1).

Figure 17:
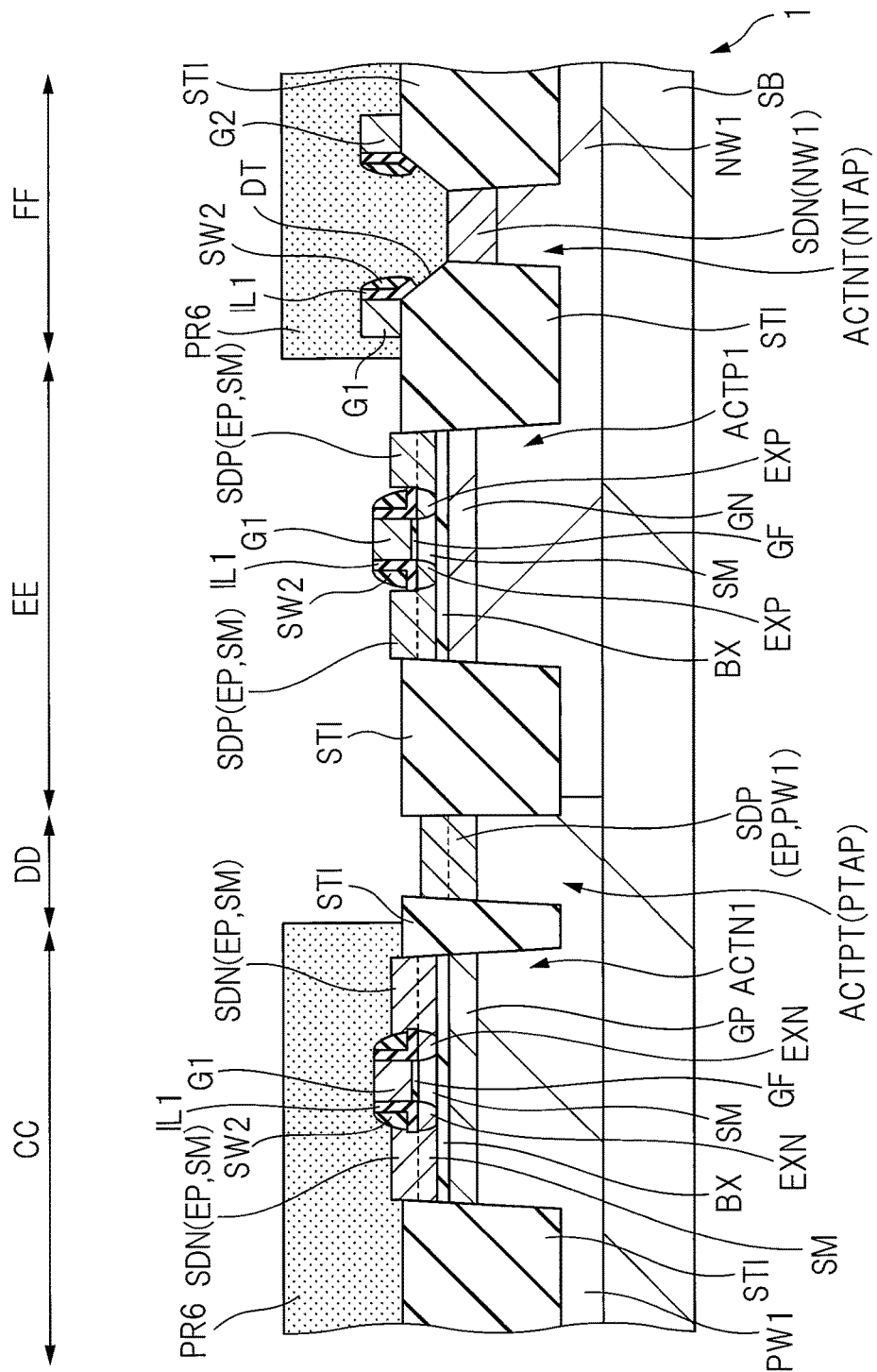
FIG. 17 is a cross-sectional view in a step of manufacturing the semiconductor device, continued from FIG. 16.

Subsequently, as shown in FIG. 17, a photoresist layer PR6 is formed on the SOI substrate 1 as mask layer. The photoresist layer PR6 covers the NMOS region NMOS1 (the region CC) and the n-type tap region NTAPR (the region FF), and exposes the p-type tap region PTAPR (the region DD) and the PMOS region PMOS1 (the region EE).

The p$^+$-type semiconductor region (source/drain region) SDP is formed by the ion implantation of p-type impurities such as boron (B) into the regions on both sides of a portion formed of the gate electrode G1 and the sidewall spacers SW2 in the semiconductor layer SM and the epitaxial layer EP of the SOI substrate 1 in the PMOS region PMOS1 (the region EE). In the ion implantation for forming the p$^+$-type semiconductor region SDP, the gate electrode G1 and the sidewall spacers SW2 on both sides of the gate electrode can function as an ion implantation blocking mask. The p$^+$-type semiconductor region SDP has a higher impurity concentration than that of the p$^-$-type semiconductor region EXP.

In the p-type tap region PTAPR (the region DD), the p$^+$-type semiconductor region SDP is formed on the semiconductor substrate SB (or the n-type well region NW1) and the epitaxial layer EP.

Figure 18:
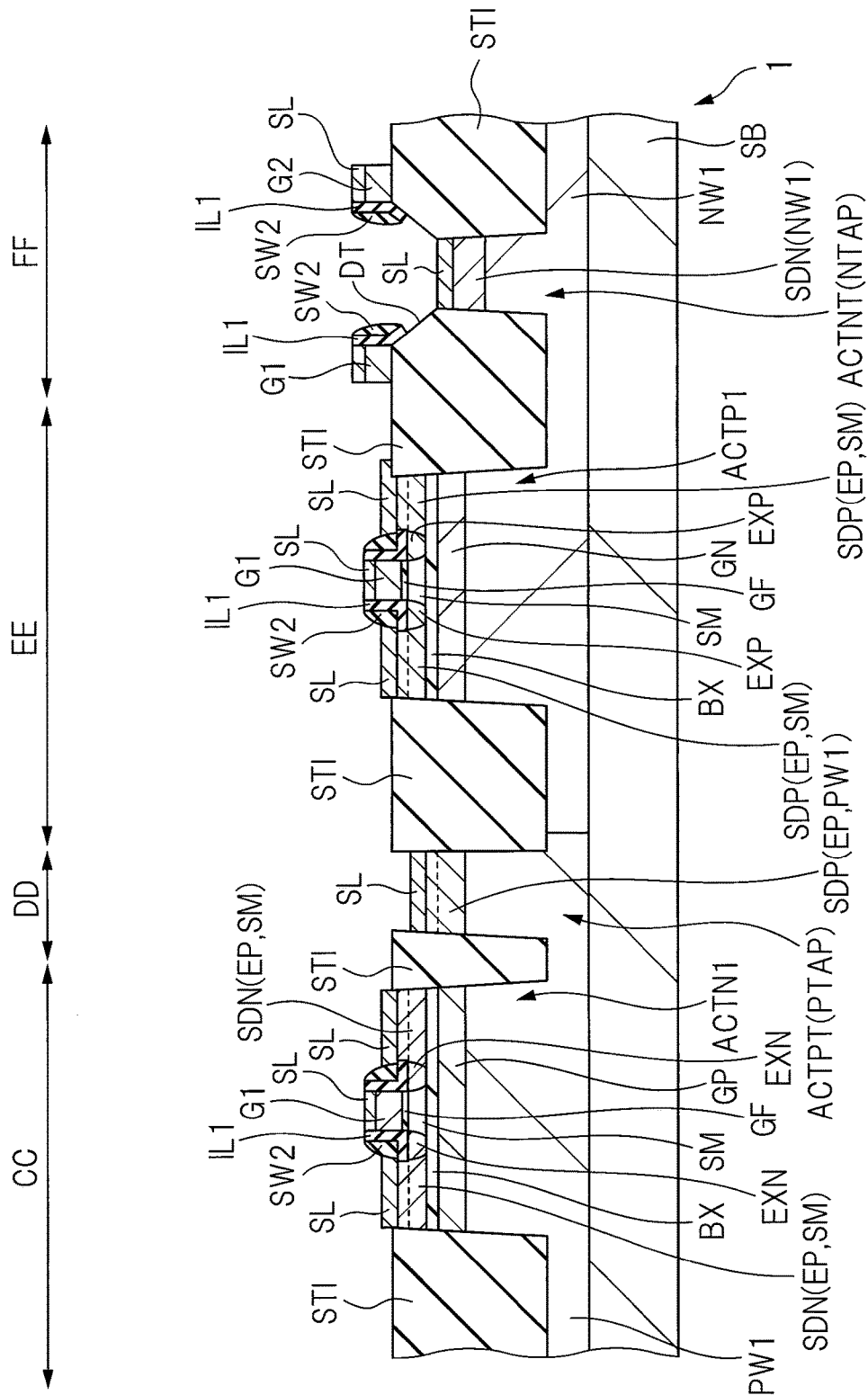
FIG. 18 is a cross-sectional view in a step of manufacturing the semiconductor device, continued from FIG. 17.

Subsequently, as shown in FIG. 18, a low resistance silicide layer SL is formed on each upper portion (surface layer portion) of the n$^+$-type semiconductor region SDN, the p$^+$-type semiconductor region SDP, and the gate electrodes G1 and G2 by a salicide (Self Aligned Silicide) technique.

Specifically, the metal silicide layer SL can be formed as follows. That is, a metal film for forming the silicide layer SL is formed on the entire main surface of the SOI substrate 1 including the element isolation region STI so as to be in contact with the gate electrodes G1 and G2, the epitaxial layer EP, and the main surface of the semiconductor substrate SB. This metal film is made of, for example, a cobalt film, a nickel film, or a nickel-platinum alloy film, and others. Then, heat treatment is applied to the SOI substrate 1 to cause reaction between the metal film and the upper portion of each of the n$^+$-type semiconductor region SDN, the p$^+$-type semiconductor region SDP, and the gate electrodes G1 and G2. As a result, the silicide layer SL is formed in the upper portion of each of the n$^+$-type semiconductor region SDN, the p$^+$-type semiconductor region SDP, and the gate electrodes G1 and G2.

Subsequently, as shown in FIG. 5, an insulating film SZ1 is formed as an inter-layer insulating film on the entire main surface of the SOT substrate 1 including the element isolation regions STI so that the insulating film SZ1 covers the gate electrodes G1 and G2, the sidewall spacer SW2, the epitaxial layer EP, and the silicide layer SL. As the insulating film SZ1, a single film of a silicon oxide film, a laminated film of a silicon nitride film and a silicon oxide film which is thick disposed on the silicon nitride film, or others can be used. After the insulating film SZ1 is formed, the upper surface of the insulating film SZ1 can be polished by a CMP method if necessary.

Subsequently, a contact hole (through hole) is formed in the insulating film SZ1 by the dry etching of the insulating film SZ1 while using, as an etching mask, a photoresist layer (not shown) formed on the insulating film SZ1 by a photolithography technique. Then, the conductive plug electrode PG made of tungsten (W) or others is formed in the contact hole. For example, the plug electrode PG can be formed by sequentially forming a barrier conductor film and a tungsten film on the insulating film SZ1 including the inside of the contact hole, and then, removing the unnecessary main conductor film and barrier conductor film outside of the contact hole by CMP method, an etch back method, or others. The plug electrode PG is electrically connected to the silicide layers SL on the $n^+$-type semiconductor region SDN and the $p^+$-type semiconductor region SDP.

Subsequently, after the insulating films SZ2 and SZ3 are formed on the insulating film SZ1 in which the plug electrode PG has been buried, a wiring trench is formed in predetermined regions of the insulating films SZ2 and SZ3, and then, a wiring M1 is buried into the wiring trenches by using a single damascene technique. Here, the insulating film SZ2 is formed as an insulating film containing nitrogen such as a silicon nitride film while the insulating film SZ3 is formed as an insulation film containing no nitrogen such as a silicon oxide film, so that the insulating film SZ2 can be used as an etching stopper when the wiring trenches in the insulating film SZ3 are formed. The wiring M1 is, for example, a copper wiring (buried copper wiring) containing copper as a main component. The wiring M1 is electrically connected to the $n^+$-type semiconductor region SDN or the $p^+$-type semiconductor region SDP through the plug electrode PG.

Then, the wirings in the second and subsequent layers are formed by a dual damascene method or others. However, illustration and explanation thereof will be omitted here.

As described above, the semiconductor device according to the present first embodiment is manufactured.

Main Features of Present First Embodiment

In the n-type tap region NTAPR, the epitaxial layer EP is not formed on the main surface of the n-type well region NW1 (i.e., the semiconductor substrate SB). More specifically, the embodiment has such a feature that the lower surface of the silicide layer SL in the active region ACTNT of the n-type tap region NTAPR is lower by d1 than the lower surface of the insulating layer BX in the active region ACTP1 which is the formation region of the p-type MISFET Qp1 (closer to the back surface of the semiconductor substrate SB). This feature can prevent the short circuit or the breakdown voltage deterioration between the n-type well region NW1 and the gate electrodes G1 or G2 of the p-type MISFET Qp1 close to the n-type tap region NTAPR.

In the p-type tap region PTAPR, the epitaxial layer EP is formed on the main surface of the p-type well region PW1 (i.e., the semiconductor substrate SB). More specifically, the embodiment has such a feature that the lower surface of the silicide layer SL in the active region ACTPT of the p-type tap region PTAPR is higher by d2 than the lower surface of the insulating layer BX in the active region ACTN1 which is the formation region of the n-type MISFET Qn1 (closer to the back surface of the semiconductor substrate SB). This feature can reduce the depth of the plug electrode PG of the p-type tap region PTAPR (i.e., the aspect ratio of the plug electrode PG, or the aspect ratio of the opening formed in the insulating film SZ1).

Second Embodiment

Figure 19:
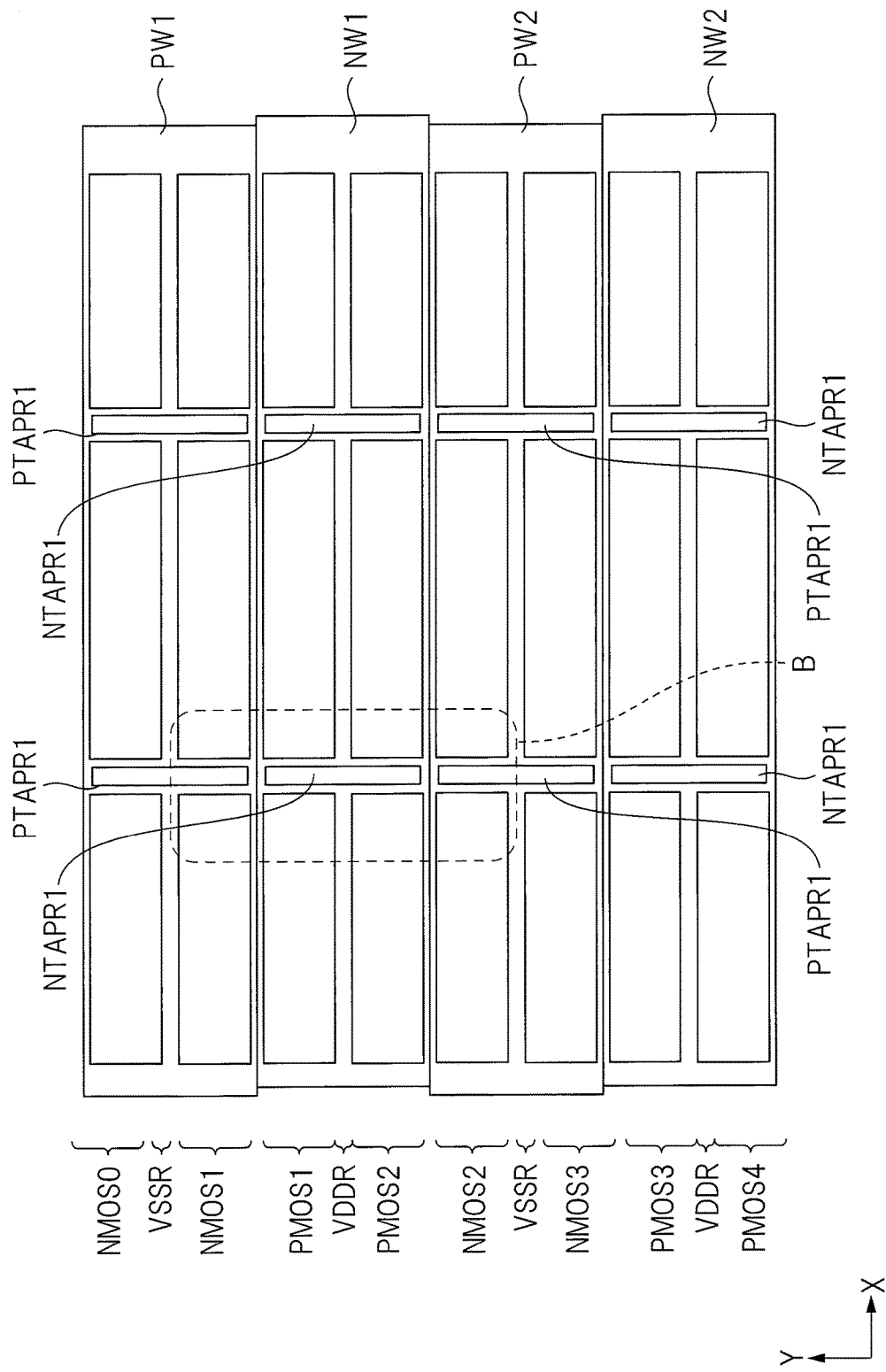
FIG. 19 is a plan view of a semiconductor device according to a second embodiment.
Figure 20:
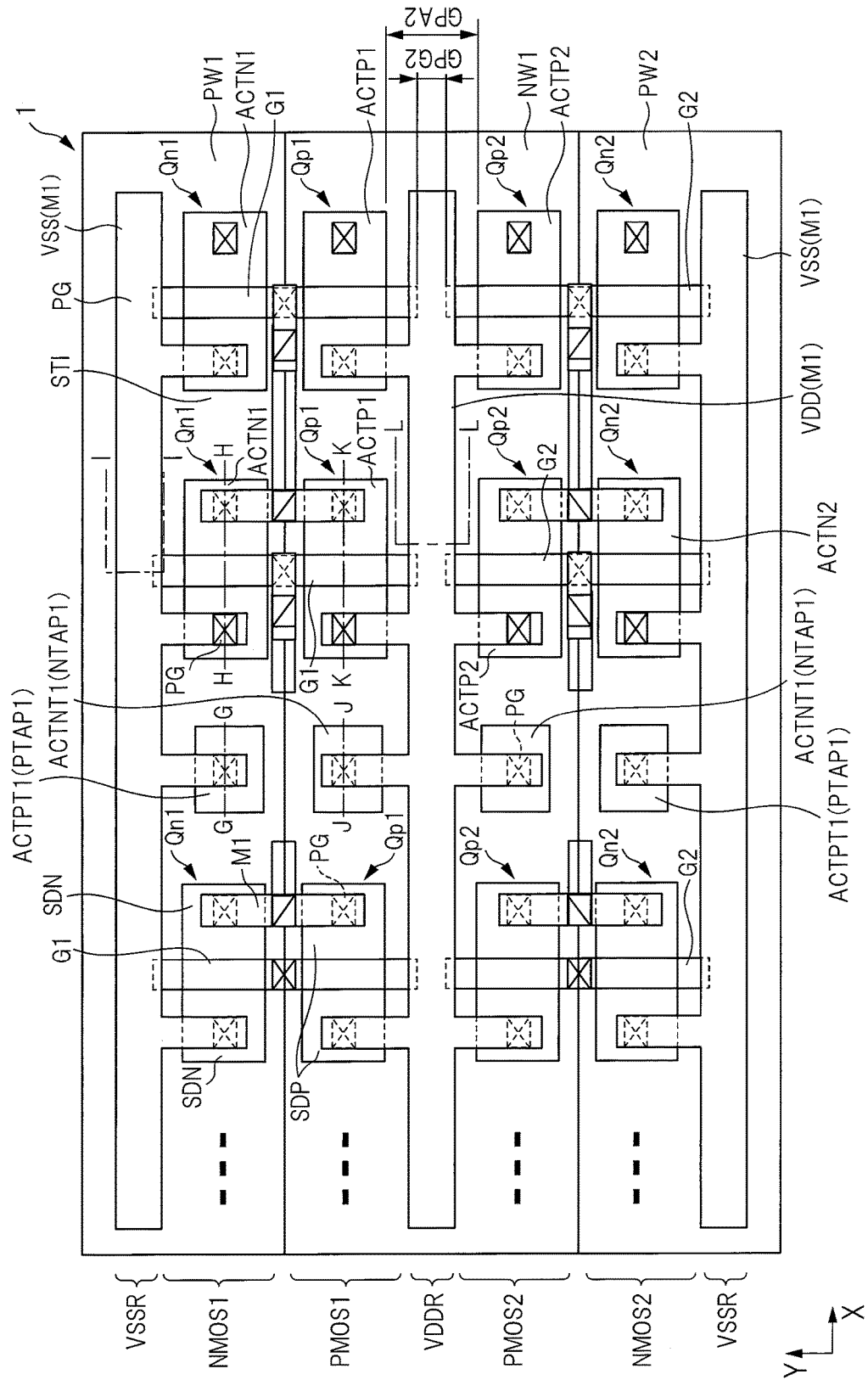
FIG. 20 is a detailed plan view of a part B of FIG. 19.
Figure 21:
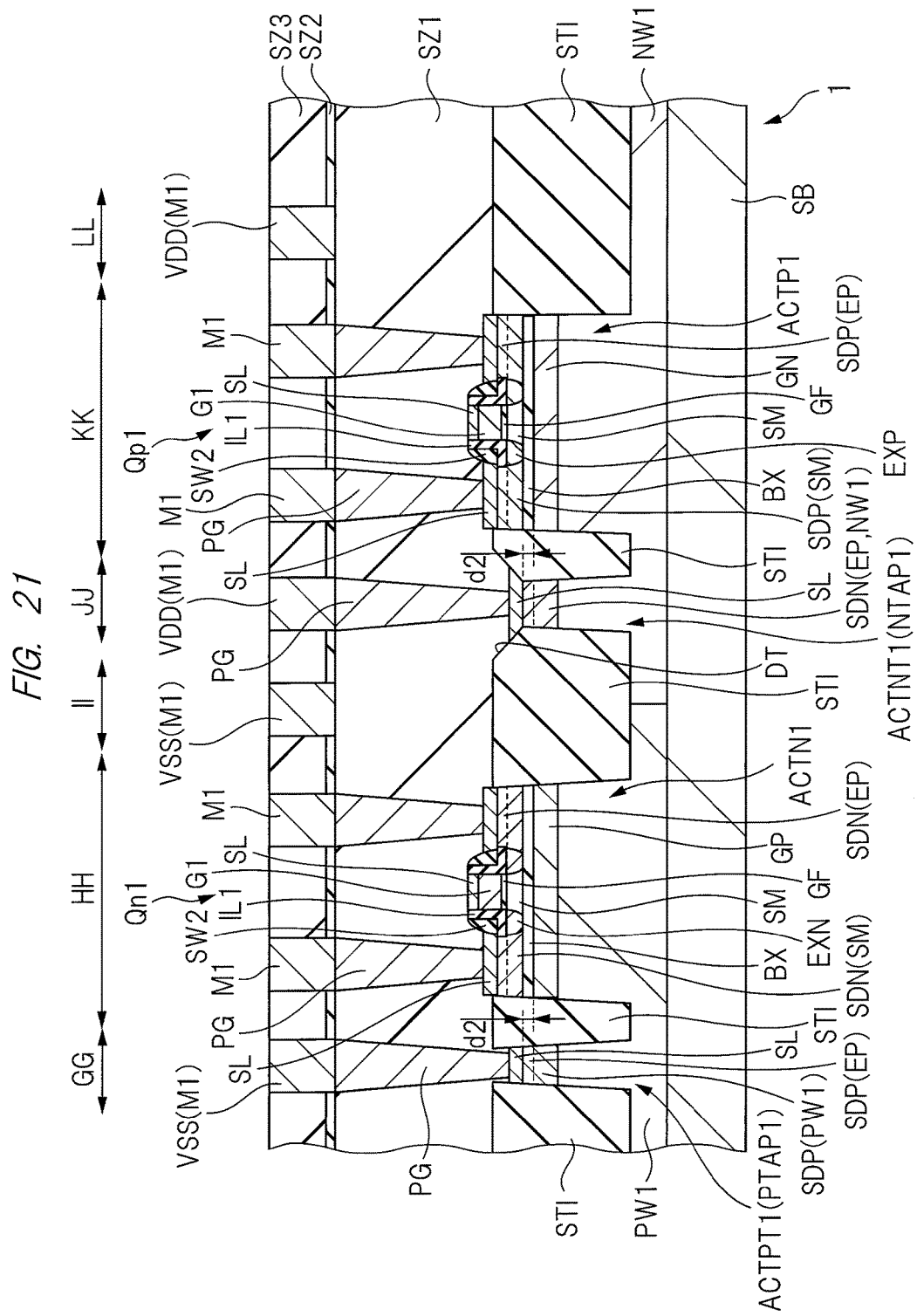
FIG. 21 is a cross-sectional view taken along lines G-G, H-H, I-I, J-J, K-K, and L-L in FIG. 20.
Figure 22:
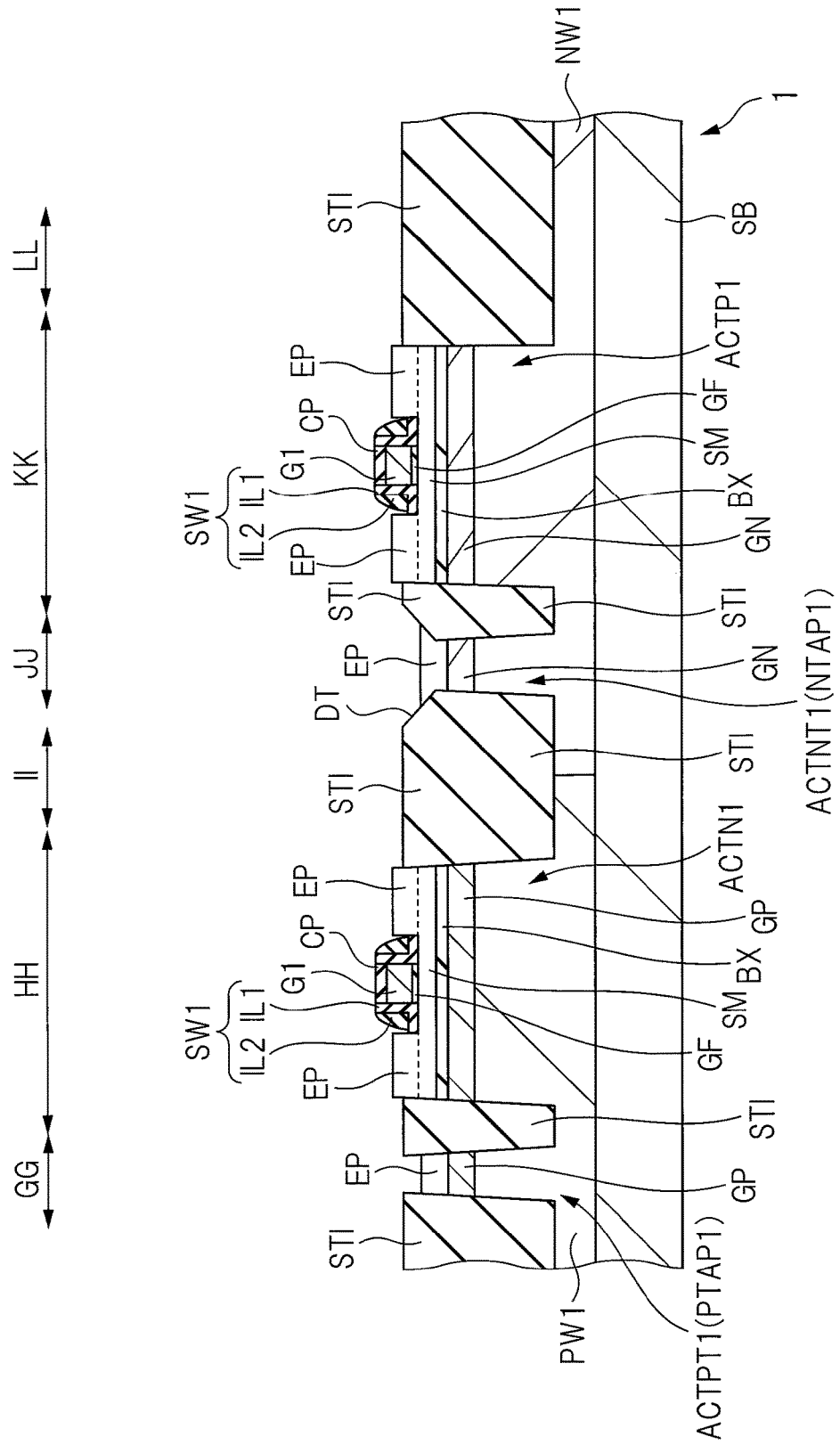
FIG. 22 is a cross-sectional view in a step of manufacturing the semiconductor device according to the second embodiment.

The present second embodiment is a modification example of the first embodiment, and only differences from the first embodiment will be explained. FIG. 19 is a plan view of a semiconductor device according to the present second embodiment. FIG. 20 is a detailed plan view of the part B of FIG. 19. FIG. 21 is a cross-sectional view taken along a line G-G, a line H-H, a line I-I, a line J-J, a line K-K, and a line L-L of FIG. 20. In FIG. 21, a cross-sectional view along the line G-G of FIG. 20 is shown in a region GG, a cross-sectional view along the line H-H of FIG. 20 is shown in a region HH, a cross-sectional view along the line I-I of FIG. 20 is shown in a region II, a cross-sectional view along the line J-J of FIG. 20 is shown in a region JJ, a cross-sectional view along the line K-K of FIG. 20 is shown in a region KK, and a cross-sectional view along the line L-L of FIG. 20 is shown in a region LL. FIG. is a cross-sectional view in a step of manufacturing the semiconductor device according to the present second embodiment. FIG. 22 corresponds to the region GG, the region HH, the region II, the region JJ, the region KK, and the region LL of FIG. 21.

In the present second embodiment, as shown in FIG. 19, the p-type tap region PTAPR1 is arranged between a plurality of NMOS regions NMOS1 which are divided in the X direction. Also, then-type tap region NTAPR1 is arranged between a plurality of PMOS regions PMOS1 which are divided in the X direction.

As shown in FIG. 20, the p-type tap PTAP1 is arranged between the plurality of n-type MISFETs Qn1 in the NMOS region NMOS1. The p-type tap PTAP1 is not arranged in the reference potential wiring region VSSR extending in the X direction. In other words, the p-type tap PTAP1 is not arranged below the reference potential wiring VSS extending in the X direction.

The n-type tap NTAP1 is arranged between the plurality of p-type MISFETs Qp1 in the PMOS region PMOS1. The n-type tap NTAP1 is not arranged in the power supply potential wiring region VDDR extending in the X direction. In other words, the n-type tap NTAP1 is not arranged below the power supply potential wiring VDD extending in the X direction.

The reference potential wiring VSS and the power supply potential wiring VDD extend in the X direction. Between them, the active region ACTN1 for the n-type MISFET Qn1, the active region ACTP1 for the p-type MISFET Qp1, the active region ACTPT1 for the p-type tap PTAP1, and the active region ACTN1 for the n-type tap NTAP1 are arranged in the Y direction.

The active region ACTNT1 constituting the n-type tap NTAP1 is not arranged in the power supply potential wiring region VDDR as described above, so that a gap GPA2 between the active region ACTP1 and the active region ACTP2 adjacent to each other in the Y direction can be smaller than that of the first embodiment, as shown in FIG. 20. In the first embodiment as shown in FIG. 4, the gap GPA1 between the active region ACTP1 and the active region ACTP2 is a summation of the width of the active region ACTNT in the Y direction and twice the separation width between the active region ACTNT and the active region ACTP1 or ACTP2.

In addition, a gap GPG2 between the gate electrode G1 and the gate electrode G2 adjacent to each other in the Y direction can be reduced. In the case of the first embodiment shown in FIG. 4, the gap GPG1 between the gate electrode G1 and the gate electrode G2 is a summation of the width of the active region ACTNT in the Y direction and twice the separation width between the active region ACTNT and the gate electrode G1 or G2.

Because of the above-described reasons, in the present second embodiment, the size of the semiconductor device in the Y direction can be reduced, and the number of elements such as MISFETs in the Y direction can be increased. If the size in the Y direction does not change, the width of the active region ACTNT in the Y direction can be further enlarged, and therefore, the driving capability can be improved, or variation in the transistor characteristics can be reduced.

In addition, the same effect as described above can be achieved for the reference potential wiring region VSSR.

In FIG. 21, the region GG shows the p-type tap region PTAPR1, the region HH shows a cross-sectional view of the n-type MI SFETQn1 in the direction of the gate length (i.e., the cross-sectional view of the NMOS region NMOS1), the region II shows the reference potential wiring region VSSR, the region JJ shows the n-type tap region NTAPR1, the region KK shows the cross-sectional view of the p-type MISFET Qp1 in the direction of the gate length (i.e., the cross-sectional view of the PMOS region PMOS1), and the region LL shows the power supply potential wiring region VDDR. The n-type MISFET Qn1 in the region HH and the p-type MISFET Qp1 in the region KK are similar to the n-type MISFET Qn1 in the region CC and the p-type MISFET Qp1 in the region EE shown in FIG. 5 of the first embodiment.

In the n-type tap region NTAPR (the region JJ), the $n^+$-type semiconductor region SDN is formed to extend from the main surface of the n-type well region NW1 to the epitaxial layer EP formed on the main surface of the n-type well region NW1 in the active region ACTNT1 surrounded by the element isolation regions STI, and the silicide layer SL is formed on the main surface in the $n^+$-type semiconductor region SDN. The n-type well region NW1 is connected to the power supply potential wiring VDD via the plug electrode PG that is in contact with the silicide layer SL. More specifically, the power supply potential supplied from the power supply potential wiring VDD is supplied to the n-type well region NW1 via the plug electrode PG, the silicide layer SL, and the $n^+$-type semiconductor region SDN.

In the n-type tap region NTAPR (the region JJ), the dent DT occurs at the shoulder portion of the element isolation region STI. However, as shown in FIG. 20, the active region NTAP1 of the n-type tap NTAP1 is arranged away from an active region ACTQ1 where the p-type MISFET Qp1 is formed. Further, the gate electrode G1 of the p-type MISFET Qp1 adjacent to the n-type tap NTAP1 extends in the Y direction, and therefore, is not close to the n-type tap NTAP1 even if the gate electrode G1 extends beyond the active region ACTQ1 and lies on the element isolation region STI. Therefore, the short circuit or the breakdown voltage deterioration between the gate electrode G1 and the n-type well region NW1 described in the related art does not occur.

In the n-type tap region NTAPR (the region JJ), the epitaxial layer EP is formed on the main surface of the semiconductor substrate SB, the $n^+$-type semiconductor region SDN is formed to extend from the epitaxial layer EP and the n-type well region NW1, and the silicide layer SL is formed on the main surface of the epitaxial layer EP. More specifically, the depth (height) of the plug electrode PG in contact with the silicide layer SL can be reduced by the film thickness of the epitaxial layer EP. The embodiment has such a feature that the lower surface of the silicide layer SL in the active region ACTNT1 (which can also be referred to as an interface between the silicide layer SL and the $n^+$-type semiconductor region SDN) is higher by d2 than the lower surface of the insulating layer BX in the active region ACTP1 (which can also be referred to as an interface between the insulating layer BX and the semiconductor layer GN or the n-type well region NW1) (farther from the back surface of the semiconductor substrate SB).

In the power supply potential wiring region VDDR (the region LL), the power supply potential wiring VDD extends on the element isolation region STI, and the entire portion below the power supply potential wiring VDD extending in the X direction serves as the element isolation region STI. Therefore, as described above, the size of the semiconductor device in the Y direction can be reduced.

In the p-type tap region PTAPR (the region GG), the $p^+$-type semiconductor region SDP is formed to extend from the main surface of the p-type well region PW1 to the epitaxial layer EP formed on the main surface of the p-type well region PW1 in the active region ACTPT1 surrounded by the element isolation regions STI, and the silicide layer SL is formed on the main surface of the $p^+$-type semiconductor region SDP. The p-type well region PW1 is connected to the reference potential wiring VSS via the plug electrode PG in contact with the silicide layer SL. More specifically, the reference potential supplied from the reference potential wiring VSS is supplied to the p-type well region PW1 via the plug electrode PG, the silicide layer SL, and the $p^+$-type semiconductor region SDP.

In the p-type tap region PTAPR (the region GG), the epitaxial layer EP is formed on the main surface of the semiconductor substrate SB, the $p^+$-type semiconductor region SDP is formed to extend from the epitaxial layer EP to the p-type well region PW1, and the silicide layer SL is formed on the main surface of the epitaxial layer EP. More specifically, the depth (height) of the plug electrode PG in contact with the silicide layer SL can be reduced by the film thickness of the epitaxial layer EP. In the p-type tap region PTAPR1, the embodiment has such a feature that the lower surface of the silicide layer SL in the active region ACTPT1 (which can also be referred to as an interface between the silicide layer SL and the $p^+$-type semiconductor region SDP) is higher by d2 than the lower surface of the insulating layer BX in the active region ACTN1 (which can also be referred to as an interface between the insulating layer BX and the semiconductor layer GP) (farther from the back surface of the semiconductor substrate SB). As similar to the first embodiment explained above, note that the dent DT of the element isolation region STI in the p-type tap region PTAPR (the region GG) is smaller than the dent DT of the element isolation region STI in the n-type tap region NTAPR (the region JJ).

In the reference potential wiring region VSSR (the region II), the reference potential wiring VSS extends on the element isolation region STI, and the entire portion below the reference potential wiring VSS extending in the X direction serves as the element isolation region STI. Therefore, as described above, the size of the semiconductor device in the Y direction can be reduced.

Subsequently, the method of manufacturing the semiconductor device according to the present second embodiment will be explained. The method of manufacturing the semiconductor device according to the present second embodiment is similar to the method of manufacturing the semiconductor device according to the first embodiment explained above, and differences thereof will be explained.

The step of preparing the SOI substrate 1 which is a step of manufacturing the semiconductor device according to the first embodiment explained above to the step of forming the sidewall spacer SW1 explained with reference to FIG. 12 are executed.

Subsequently, the step of forming the epitaxial layer EP explained with reference to FIG. 13 according to the first embodiment is executed. As shown in FIG. 22, the epitaxial layer EP is also formed in the n-type tap region NTAPR (the region JJ). More specifically, the epitaxial layer EP is formed in the p-type tap region PTAPR (the region GG), the NMOS region NMOS1, (the region HH), the n-type tap region NTAPR (the region JJ), and the PMOS region PMOS1 (the region KK).

Subsequently, the step of removing the insulating film IL2 constituting the sidewall spacer SW1 is executed, and then, the step of forming the n⁻-type semiconductor region (extension region) EXN and subsequent steps explained with reference to FIG. 14 are executed, so that the semiconductor device according to the present second embodiment is completed.

Third Embodiment

Figure 23:
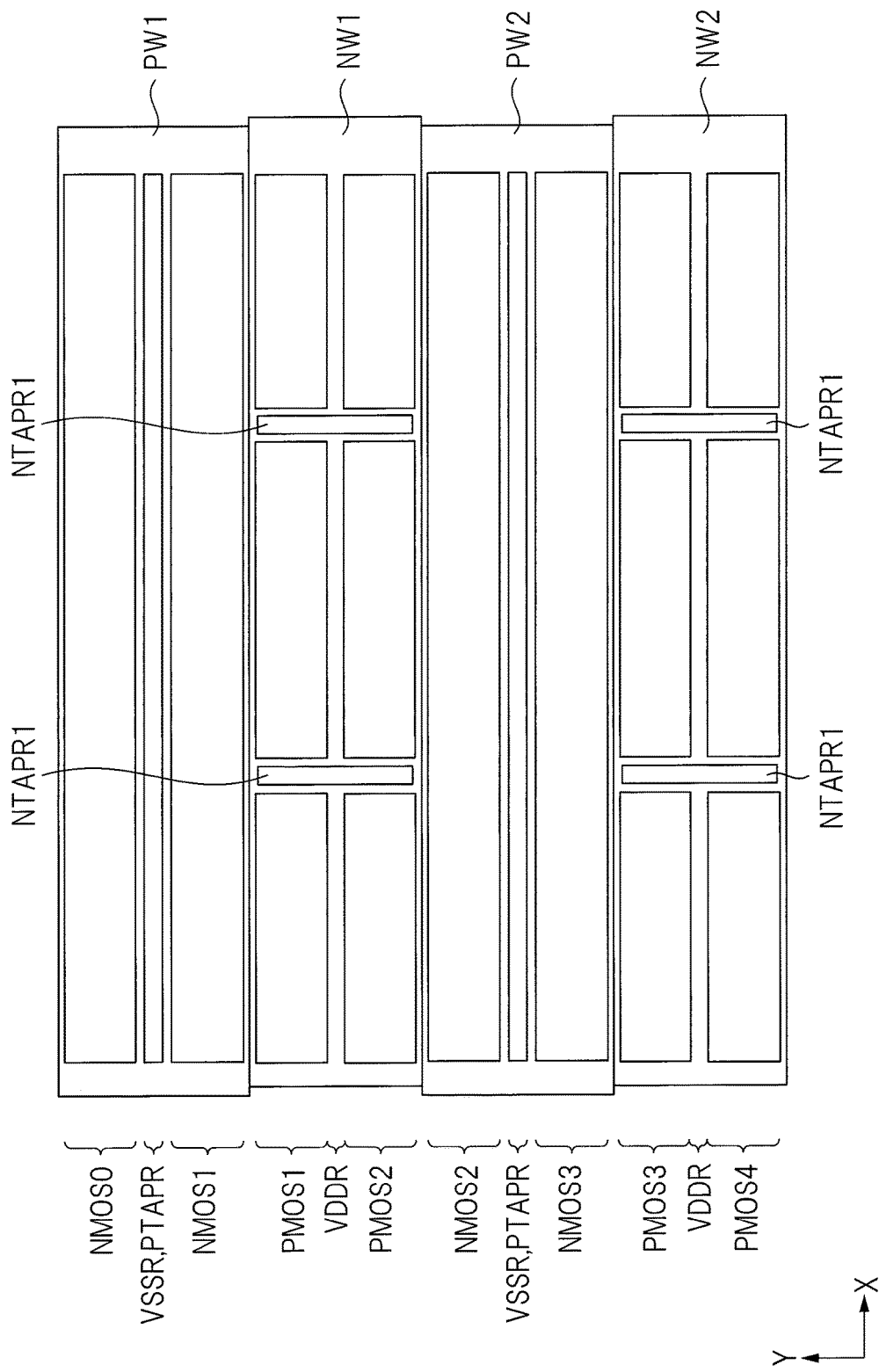
FIG. 23 is a plan view of a semiconductor device according to a third embodiment.

FIG. 23 is a plan view of a semiconductor device according to the present third embodiment.

As shown in FIG. 23, the semiconductor device according to the present third embodiment uses the structure of the first embodiment for the NMOS regions NMOS0 to NMOS3 and the p-type tap region PTAPR in the p-type wells PW1 and PW2, and uses the structure of the second embodiment for the PMOS regions PMOS1 to PMOS4 and the n-type tap region NTAPR1 in the n-type well regions NW1 and NW2. More specifically, the structure of the second embodiment can be employed only for a portion that is largely affected by the dent DT of the element isolation region STI. As a result, the flexibility of the layout design can be increased.

Fourth Embodiment

Figure 24:
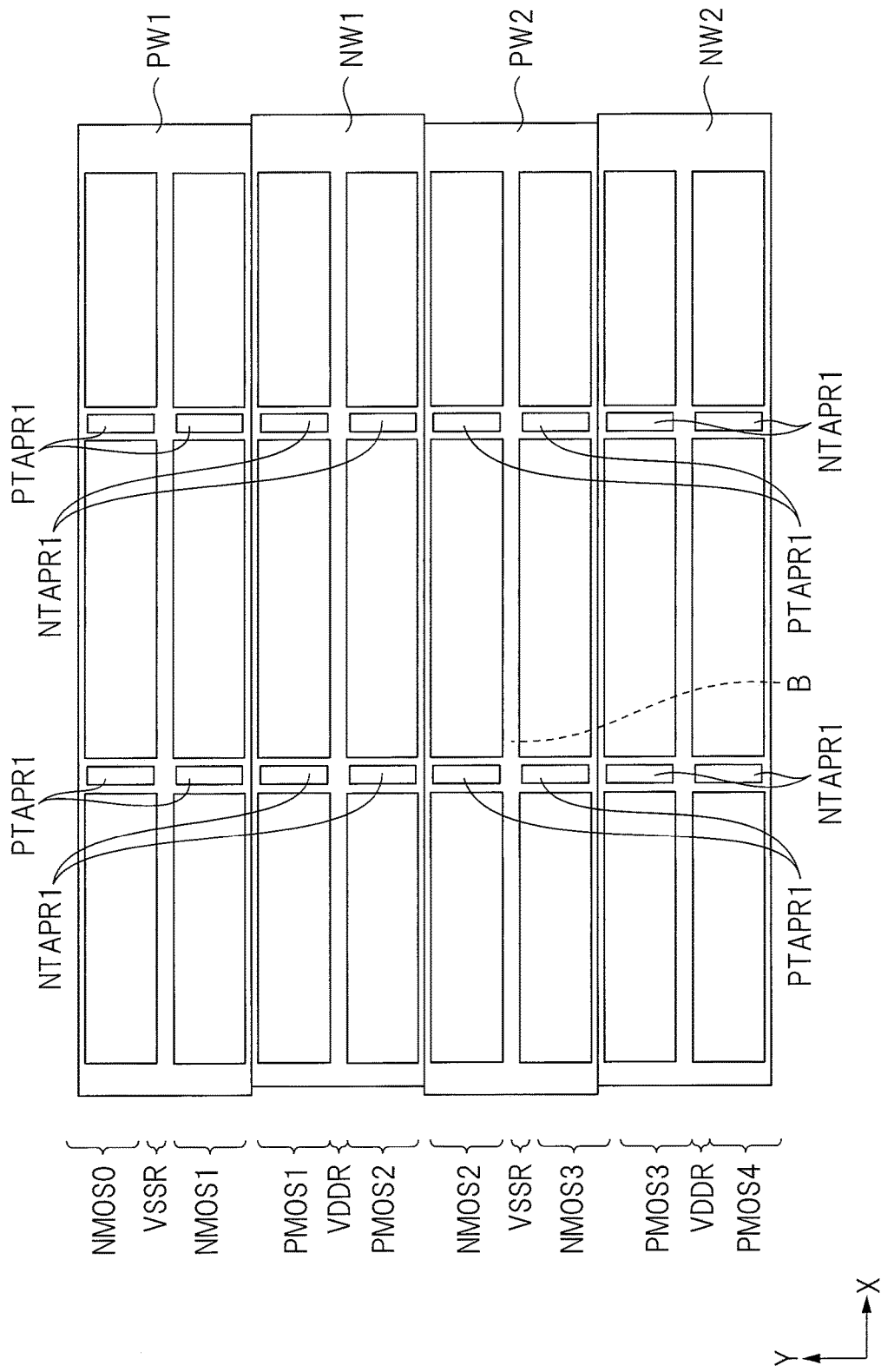
FIG. 24 is a plan view of a semiconductor device according to a fourth embodiment.

FIG. 24 is a plan view of a semiconductor device according to the present fourth embodiment, and is a modification example of the second embodiment.

As similar to FIG. 19, in FIG. 24, the p-type tap region PTAPR1 is arranged between the plurality of NMOS regions NMOS1 divided in the X direction. The n-type tap region NTAPR1 is also arranged between the plurality of PMOS regions PMOS1 divided in the X direction.

Differences from FIG. 19 will be explained. In FIG. 19, the n-type tap region NTAPR1 is common between the PMOS region PMOS1 and the PMOS region PMOS2 in the Y direction. On the other hand, in FIG. 24, the n-type tap region NTAPR1 located between the PMOS regions PMOS1 and the n-type tap region NTAPR1 located between the PMOS regions PMOS2 are isolated from each other by the element isolation region STI. More specifically, in the power supply potential wiring region VDDR, the n-type tap region NTAPR1 is not formed while the element isolation region STI is arranged.

Similarly, the p-type tap region PTAPR1 located between the NMOS regions NMOS0 and the p-type tap region PTAPR1 located between the NMOS regions NMOS1 are isolated from each other by the element isolation region STI. More specifically, in the reference potential wiring region VSSR, the p-type tap region PTAPR1 is not formed while the element isolation region STI is arranged.

Note that the layout of the wirings is similar to the structure as shown in FIG. 20. The cross-sectional structure is also similar to those of the region GG and the region JJ as shown in FIG. 21. Therefore, the reference potential wiring VSS is connected to each p-type tap region PTAPR1, and the power supply potential wiring VDD is connected to each n-type tap region NTAPR1.

Thus, the fourth embodiment can also obtain the effects similar to those of the second embodiment. In the Y direction, the p-type tap region PTAPR1 and the n-type tap region NTAPR1 are isolated from each other, and therefore, the size of the semiconductor device in the Y direction can be further reduced than in the second embodiment.

As similar to the third embodiment, the structure of the first embodiment can be also used for the NMOS regions NMOS1 to NMOS4 and the p-type tap region PTAPR1 in the p-type well regions PW1 and PW2.

The structure of the third embodiment can be also employed for the PMOS regions PMOS1 to PMOS4 and the n-type tap region NTAPR1 in the n-type well regions NW1 and NW2, and the structure of the fourth embodiment can be also employed for the NMOS regions NMOS1 to NMOS4 and the p-type tap region PTAPR1 in the p-type well regions PW1 and PW2.

The structure of the fourth embodiment can be also employed for the PMOS regions PMOS1 to PMOS4 and the n-type tap region NTAPR1 in the n-type well regions NW1 and NW2, and the structure of the third embodiment can be also employed for the NMOS regions NMOS1 to NMOS4 and the p-type tap region PTAPR1 in the p-type well regions PW1 and PW2.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:
1. A semiconductor device comprising:
a semiconductor substrate including a main surface and a back surface;
a first semiconductor region of a first conductivity type formed in the semiconductor substrate;
a first active region and a second active region whose peripheries are defined by an element isolation region, in the first semiconductor region;
a first semiconductor layer formed on the main surface of the semiconductor substrate via a first insulating film, in the first active region;
a first gate electrode formed on a surface of the first semiconductor layer via a first gate insulating film;
a first sidewall spacer formed on a side wall of the first gate electrode;
first epitaxial layers formed on the first semiconductor layer at both sides of the first gate electrode;
a second semiconductor region and a third semiconductor region of a second conductivity type formed in the first semiconductor layer and the first epitaxial layers at both sides of the first gate electrode, the second conductivity type being a conductivity type opposite to the first conductivity type;
a fourth semiconductor region of the first conductivity type formed below the first insulating film, in the first active region;
a first silicide layer formed on a surface of the first semiconductor region, in the second active region;
an interlayer insulating film covering the first gate electrode; and
a first power supply wiring formed over the interlayer insulating film,
wherein, in a plan view, the second active region extends in a first direction, wherein, in a plan view, the first power supply wiring extends in the first direction so as to overlap with the second active region,
wherein the first power supply wiring is connected to the second semiconductor region,
wherein the first gate electrode extends in a second direction perpendicular to the first direction, and lies on the element isolation region between the first active region and the second active region, and
wherein the first silicide layer is connected to the first power supply wiring.

2. The semiconductor device according to claim 1,
wherein an interface between the first silicide layer and the first semiconductor region is closer to the back surface of the semiconductor substrate than an interface between the first insulating film and the fourth semiconductor region.

3. The semiconductor device according to claim 1, further comprising
a fifth semiconductor region of the second conductivity type formed below the first sidewall spacer in the first semiconductor layer.

4. The semiconductor device according to claim 3,
wherein an impurity concentration of each of the second semiconductor region and the third semiconductor region is higher than an impurity concentration of the fifth semiconductor region.

5. The semiconductor device according to claim 1,
wherein the first conductivity type is an N-type, and the second conductivity type is a P-type.

6. The semiconductor device according to claim 1, further comprising:
a sixth semiconductor region of the second conductivity type formed in the semiconductor substrate;
a third active region and a fourth active region whose peripheries are defined by the element isolation region in the sixth semiconductor region;
a second semiconductor layer formed on the main surface of the semiconductor substrate via a second insulating film in the third active region;
a second gate electrode formed on a surface of the second semiconductor layer via a second gate insulating film;
a second sidewall spacer formed on a side wall of the second gate electrode;
second epitaxial layers formed on the second semiconductor layer at both sides of the second gate electrode;
a seventh semiconductor region and an eighth semiconductor region of the first conductivity type formed in the second semiconductor layer and the second epitaxial layers at both sides of the second gate electrode;
a ninth semiconductor region of the second conductivity type formed below the second insulating film in the third active region;
a third epitaxial layer formed on the sixth semiconductor region in the fourth active region;
a second silicide layer formed on a surface of the third epitaxial layer;
the interlayer insulating film covering the second gate electrode; and
a second power supply wiring formed over the interlayer insulating film,
wherein, in a plan view, the fourth active region extends in the first direction,
wherein, in a plan view, the second power supply wiring extends in the first direction so as to overlap with the fourth active region,
wherein the second power supply wiring is connected to the seventh semiconductor region, and
wherein the second gate electrode extends in the second direction, and lies on the element isolation region between the third active region and the fourth active region.

7. The semiconductor device according to claim 6,
wherein the second silicide layer is connected to the second power supply wiring.

8. The semiconductor device according to claim 6,
wherein an interface between the second silicide layer and the third epitaxial layer is farther from the back surface of the semiconductor substrate than an interface between the second insulating film and the ninth semiconductor region.

9. The semiconductor device according to claim 6,
wherein, in a plan view, the first active region and the third active region are arranged in the second direction, and are sandwiched between the second active region and the fourth active region extending in the first direction.

10. A semiconductor device comprising:
a semiconductor substrate including a main surface and a back surface;
a first semiconductor region of a first conductivity type formed in the semiconductor substrate;
a first active region and a second active region whose peripheries are defined by an element isolation region, in the first semiconductor region;
a first semiconductor layer formed on the main surface of the semiconductor substrate via a first insulating film, in the first active region;
a first gate electrode formed on a surface of the first semiconductor layer via a first gate insulating film;
a first sidewall spacer formed on a side wall of the first gate electrode;
first epitaxial layers formed on the first semiconductor layer at both sides of the first gate electrode;
a second semiconductor region and a third semiconductor region of a second conductivity type formed in the first semiconductor layer and the first epitaxial layers at both sides of the first gate electrode, the second conductivity type being a conductivity type opposite to the first conductivity type;
a fourth semiconductor region of the first conductivity type formed below the first insulating film, in the first active region;
a first silicide layer formed on a surface of the first semiconductor region, in the second active region;
an interlayer insulating film covering the first gate electrode; and
a first power supply wiring formed over the interlayer insulating film,
wherein, in a plan view, the second active region extends in a first direction,
wherein, in a plan view, the first power supply wiring extends in the first direction so as to overlap with the second active region,
wherein the first power supply wiring is connected to the second semiconductor region,
wherein the first gate electrode extends in a second direction perpendicular to the first direction, and lies on the element isolation region between the first active region and the second active region,
wherein the semiconductor device further comprises:
a sixth semiconductor region of the second conductivity type formed in the semiconductor substrate;

a third active region and a fourth active region whose peripheries are defined by the element isolation region in the sixth semiconductor region;

a second semiconductor layer formed on the main surface of the semiconductor substrate via a second insulating film in the third active region;

a second gate electrode formed on a surface of the second semiconductor layer via a second gate insulating film;

a second sidewall spacer formed on a side wall of the second gate electrode;

second epitaxial layers formed on the second semiconductor layer at both sides of the second gate electrode;

a seventh semiconductor region and an eighth semiconductor region of the first conductivity type formed in the second semiconductor layer and the second epitaxial layers at both sides of the second gate electrode;

a ninth semiconductor region of the second conductivity type formed below the second insulating film in the third active region;

a third epitaxial layer formed on the sixth semiconductor region in the fourth active region;

a second silicide layer formed on a surface of the third epitaxial layer;

the interlayer insulating film covering the second gate electrode; and a second power supply wiring formed over the interlayer insulating film, wherein, in a plan view, the fourth active region extends in the first direction, wherein, in a plan view, the second power supply wiring extends in the first direction so as to overlap with the fourth active region, wherein the second power supply wiring is connected to the seventh semiconductor region, and wherein the second gate electrode extends in the second direction, and lies on the element isolation region between the third active region and the fourth active region.

11. The semiconductor device according to claim 10, wherein the second silicide layer is connected to the second power supply wiring.

12. The semiconductor device according to claim 10, wherein an interface between the second silicide layer and the third epitaxial layer is farther from the back surface of the semiconductor substrate than an interface between the second insulating film and the ninth semiconductor region.

13. The semiconductor device according to claim 10, wherein, in a plan view, the first active region and the third active region are arranged in the second direction, and are sandwiched between the second active region and the fourth active region extending in the first direction.

* * * * *